United States Patent
Wilson et al.

(10) Patent No.: US 9,430,148 B2
(45) Date of Patent: Aug. 30, 2016

(54) MULTIPLEXED SYNCHRONOUS SERIAL PORT COMMUNICATION WITH SKEW CONTROL FOR STORAGE DEVICE

(71) Applicant: LSI Corporation, San Jose, CA (US)

(72) Inventors: Ross S. Wilson, Menlo Park, CA (US); David W. Kelly, Eagan, MN (US); Daniel J. Dolan, Cottage Grove, MN (US); Richard Rauschmayer, Longmont, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 215 days.

(21) Appl. No.: 14/267,344

(22) Filed: May 1, 2014

(65) Prior Publication Data

US 2015/0318030 A1 Nov. 5, 2015

(51) Int. Cl.
*G06F 13/00* (2006.01)
*G06F 3/06* (2006.01)
*G11C 7/10* (2006.01)

(52) U.S. Cl.
CPC ............. *G06F 3/06* (2013.01); *G11C 7/1072* (2013.01)

(58) Field of Classification Search
CPC ................... G11C 7/1072; G06F 3/06
See application file for complete search history.

(56) References Cited

U.S. PATENT DOCUMENTS

| | | | | |
|---|---|---|---|---|
| 5,872,992 A * | 2/1999 | Tietjen | ................ | G06F 13/4213 712/28 |
| 6,104,565 A | 8/2000 | Bruner et al. | | |
| 6,111,717 A * | 8/2000 | Cloke | ................... | G11B 5/012 360/25 |
| 6,351,427 B1 | 2/2002 | Brown | | |
| 6,424,476 B1 * | 7/2002 | Matsubara | ............... | G11B 5/09 360/32 |
| 7,239,650 B2 * | 7/2007 | Rakib | ................ | H03M 13/256 348/E7.07 |
| 7,957,370 B2 | 6/2011 | Behrens et al. | | |
| 8,055,857 B2 * | 11/2011 | Brox | ................... | G06F 13/1673 711/154 |
| 8,289,821 B1 | 10/2012 | Huber | | |
| 8,351,281 B2 | 1/2013 | Perego et al. | | |
| 8,417,873 B1 | 4/2013 | Karamcheti et al. | | |
| 8,880,768 B2 * | 11/2014 | Mathew | ............. | G06F 13/4221 710/20 |
| 2004/0116151 A1 * | 6/2004 | Bosch | ................ | G06F 13/4291 455/550.1 |
| 2006/0193071 A1 * | 8/2006 | Choi | ........................ | G11B 5/02 360/46 |
| 2007/0116055 A1 * | 5/2007 | Atsumi | ................ | H04J 3/1658 370/476 |
| 2007/0236819 A1 * | 10/2007 | Hashizume | ............. | G11B 5/09 360/67 |

(Continued)

OTHER PUBLICATIONS

Analog Devices, Application Note AN-877, Interfacing to High Speed ADCs via SPI, by the High Speed Converter Division, 2005-2007, 20 pages.

(Continued)

*Primary Examiner* — Jing-Yih Shyu

(57) ABSTRACT

A method is provided, for example, to implement multiplexed communication between a controller and a preamplifier in a storage device. For example, multiplexed communication is implemented by controlling a bidirectional serial data line of a digital bus to selectively transmit digital signals in either a first direction from the controller to the preamplifier or a second direction from the preamplifier to the controller, in response to a direction control signal, and concurrently transmitting a synchronous clock signal over a clock signal line of the digital bus from the controller to the preamplifier to synchronize transfer and processing of the digital signals transmitted on the bidirectional serial data line of the digital bus. The direction control signal is transmitted from the controller to the preamplifier on one of the bidirectional serial data line and the clock signal line of the digital bus.

22 Claims, 10 Drawing Sheets

(56) References Cited

U.S. PATENT DOCUMENTS

| | | | |
|---|---|---|---|
| 2008/0175589 A1* | 7/2008 | Perkins | H04J 14/02 398/34 |
| 2009/0300237 A1* | 12/2009 | Nobunaga | G06F 13/1694 710/61 |
| 2012/0275279 A1 | 11/2012 | Wilson et al. | |
| 2013/0083419 A1* | 4/2013 | Springberg | G11B 5/09 360/46 |
| 2013/0128375 A1 | 5/2013 | Livshitz et al. | |
| 2013/0262907 A1 | 10/2013 | Zitlaw | |
| 2013/0329482 A1* | 12/2013 | Gillingham | G06F 13/1689 365/63 |
| 2014/0104716 A1* | 4/2014 | Wilson | G11B 5/09 360/46 |

OTHER PUBLICATIONS

AN10216-01 I2C Manual, Philips Semiconductors, Mar. 24, 2003, 51 pages.

U.S. Appl. No. 14/085,816, filed Nov. 21, 2013, entitled "Storage System With Pattern Dependent Write."

U.S. Appl. No. 13/719,615, filed Dec. 19, 2012, entitled "Tag Multiplication Via a Preamplifier Interface."

* cited by examiner

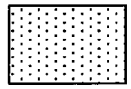 SIGNAL USED IN WRITE:  RECORDING CHANNEL ⟶ PREAMPLIFIER

 SIGNAL USED IN WRITE:  PREAMPLIFIER ⟶ RECORDING CHANNEL

 SIGNAL USED IN READ:  PREAMPLIFIER ⟶ RECORDING CHANNEL

| 400 | MULTIPLEXING READ / WRITE ANALOG SIGNALS:  THREE CHANNEL TDMR | | | | | |
|---|---|---|---|---|---|---|
| | Basic | | Basic With Pulsed HAMR or PDW | | Basic With Pulsed HAMR and/or PDW and BPM | |
| | Non-MUX | MUX | Non-MUX | MUX | Non-MUX | MUX |
| Differential Pair 1 | ± RD1 | ± RD1<br>± WD | ± RD1 | ± RD1<br>± WD | ± RD1 | ± RD1<br>± WD |
| Differential Pair 2 | ± RD2 | ± RD2 | ± RD2 | ± RD2<br>± LC | ± RD2 | ± RD2<br>± LC |
| Differential Pair 3 | ± RD3 | ± RD3 | ± RD3 | ± RD3 | ± RD3 | ± RD3<br>± BP |
| Differential Pair 4 | ± WD | | ± WD | | ± WD | |
| Differential Pair 5 | | | ± LC | | ± LC | |
| Differential Pair 6 | | | | | ± BP | |
| # Differential Pairs Needed | 4 | 3 | 5 | 3 | 6 | 3 |

MULTIPLEXED SYNCHRONOUS SERIAL PORT COMMUNICATION WITH SKEW CONTROL FOR STORAGE DEVICE

FIELD OF THE INVENTION

The field generally relates to data storage devices and, in particular, to communication between components of a data storage device.

BACKGROUND

Data storage devices such as hard disk drives are utilized for non-volatile data storage in a wide variety of data processing systems. In a magnetic disk storage device, a storage disk comprises a substrate made from a non-magnetic material, such as aluminum or glass, which is coated with one or more thin layers of magnetic material. In operation, data is read from, and written to, tracks of a magnetic storage disk using a magnetic head that includes a read sensor and write element. In general, a storage device includes a preamplifier that is configured to drive a read sensor in the magnetic head to read data from a magnetic storage disk and amplify the read data, as well as drive a write element in the magnetic to write data to the storage disk. Moreover, a storage device includes recording channel that is configured to decode read data that is received from the preamplifier, and encode write data that is to be written to the storage disk. Communication between the preamplifier and the recording channel is implemented using an analog bus and a digital bus, for example. A conventional analog bus comprises a plurality of analog signal lines, which enable high-speed transmission of analog read and write data signals between the recording channel and the preamplifier. Each analog signal line is a dedicated line that transmits either read data or write data. Further, a conventional digital bus implements a three wire serial port comprising a clock signal line, a data line, and an enable line, which serves to transmit digital control signals for setup and status monitoring of configuration registers located within the preamplifier. Other digital control functions that require dedicated digital control lines and which cannot tolerate the polling and latency characteristic of the serial port are transmitted on a bit-significant basis on additional dedicated control bus lines. These conventional communication schemes are inefficient in terms of the number of signal lines that are required to transmit data and control signals between the recording channel, preamplifier, and a controller.

SUMMARY

In an embodiment of the invention, a method is provided to implement multiplexed communication between a controller and a preamplifier in a storage device. For example, multiplexed communication is implemented by controlling a bidirectional serial data line of a digital bus to selectively transmit digital signals in either a first direction from the controller to the preamplifier or a second direction from the preamplifier to the controller, in response to a direction control signal, and concurrently transmitting a synchronous clock signal over a clock signal line of the digital bus from the controller to the preamplifier to synchronize transfer and processing of the digital signals transmitted on the bidirectional serial data line of the digital bus. The direction control signal is transmitted from the controller to the preamplifier on one of the bidirectional serial data line and the clock signal line of the digital bus.

Other embodiments include, without limitation, circuits, systems, integrated circuit devices, storage devices, storage systems, and computer-readable media.

DESCRIPTION OF THE FIGURES

FIG. 4 is a table that comparatively illustrates a number of signal lines needed for a non-multiplexed analog bus as compared to a number of signal lines used for a multiplexed analog bus according to various embodiments of the invention.

WRITTEN DESCRIPTION

Figure 1:
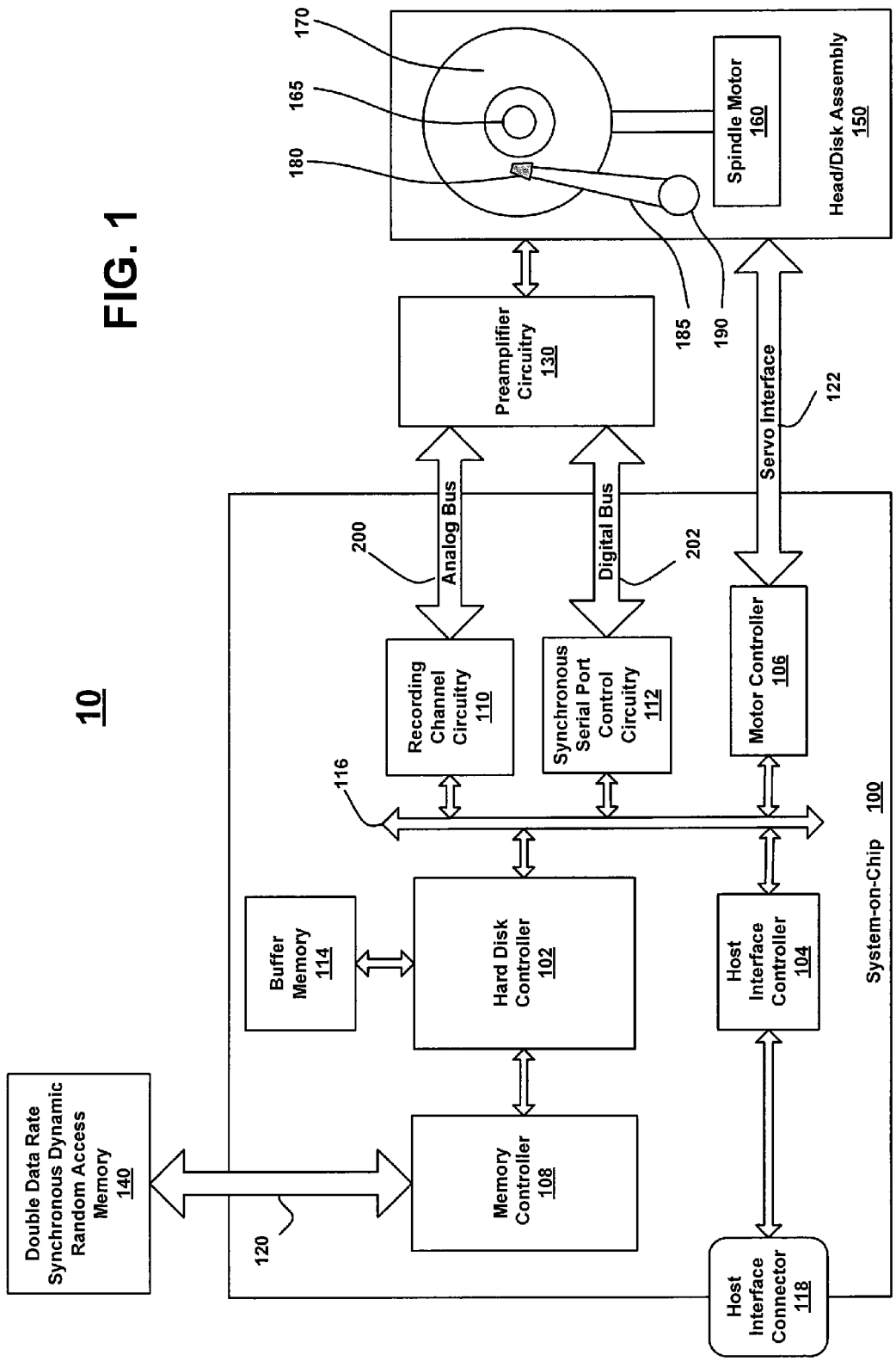
FIG. 1 schematically illustrates a storage device according to an embodiment of the invention.

FIG. 1 schematically illustrates a storage device 10 according to an embodiment of the invention. The storage device 10 comprises a system-on-chip 100 that includes various integrated circuits such as a hard disk controller 102, a host interface controller 104, a motor controller 106, a memory controller 108, recording channel circuitry 110, synchronous serial port control circuitry 112, and buffer memory 114. An internal bus 116 enables communication between the hard disk controller 102, the host interface controller 104, the motor controller 106, the recording channel circuitry 110, and the synchronous serial port control circuitry 112. The system-on-chip 100 further comprises a plurality of interfaces such as a host interface connector 118, a memory interface 120, and a servo interface 122. The storage device 10 further comprises preamplifier circuitry 130, an external random access memory 140, and a read/write head and disk assembly 150.

The storage device 10 further comprises an analog bus 200 and a digital bus 202. The analog bus 200 connects the recording channel circuitry 110 and the preamplifier circuitry 130. The digital bus 202 connects the synchronous serial port control circuitry 112 and the preamplifier circuitry 130. In one embodiment of the invention, the analog bus 200 comprises a plurality of analog lines that are controlled by multiplexing circuitry, wherein the multiplexing circuitry controls bidirectional transmission of read and write information signals between the recording channel circuitry 110 and the preamplifier circuitry 130 over one or more analog lines of the analog bus 200.

Further, in one embodiment of the invention, the digital bus 202 comprises a clock signal line and a bidirectional serial data line connected between the synchronous serial port control circuitry 112 and the preamplifier circuitry 130. The bidirectional serial data line of the digital bus 202 is controlled by multiplexing circuitry, wherein the multiplexing circuitry controls bidirectional transmission of various digital signals between the synchronous serial port control circuitry 112 and the preamplifier circuitry 130 over the bidirectional serial data line. The synchronous serial port control circuitry 112 comprises master port logic circuitry that operates in conjunction with slave port logic circuitry in the preamplifier circuit 130 to control the multiplexed, bidirectional transfer of digital signals over the digital bus 202. Moreover, the synchronous serial port control circuitry 112 generates a synchronous clock signal that is transmitted on the clock signal line of the digital bus 202 from the synchronous serial port control circuitry 112 to the preamplifier circuitry 130. The synchronous clock signal serves to synchronize transfer and processing of the digital signals transmitted on the bidirectional serial data line of the digital bus 202.

In one embodiment of the invention, the analog bus 200 and digital bus 202 are implemented using a flexible cable or flex-cable in which signal transmission is implemented using differential driver circuitry. As explained in further detail below, by using multiplexing circuitry to share signal lines for transmitting different types of information signals over the analog bus 200 and digital bus 202, the number of individual signal lines that are used to implement the analog bus 200 and digital bus 202 to transmit such signals is minimized. Example embodiments of the analog bus 200 and the digital bus 202 and the associated multiplexing control interface will be explained in further detail below with reference to FIGS. 2 and 3, for example.

In general, the preamplifier circuitry 130 is implemented using a process technology that is optimized for transmission and/or processing of analog signals. For example, in one embodiment, the preamplifier circuitry 130 is implemented using a mixed bipolar and CMOS processing technology. The recording channel circuitry 110 is implemented using a process technology that is optimized for transmission and/or processing of digital signals. For example, in one embodiment of the invention, the recording channel circuitry 110 is implemented using a CMOS processing technology.

The read/write head and disk assembly 150 comprises various components such as a spindle motor 160, a spindle 165, a storage medium 170, a magnetic read/write head 180 (or simply, "magnetic head") disposed on one end of a positioning arm 185, and an actuator motor 190 (or voice coil motor) connected to one end of the positioning arm 185 opposite the magnetic head 180. The storage medium 170 has a storage surface coated with one or more magnetic materials that are capable of storing data bits in the form of respective groups of media grains oriented in a common magnetization direction (e.g., up or down). The storage medium 170 is connected to the spindle 165, and the spindle 165 is driven by the spindle motor 160 to spin the storage medium 170 at high speed. Data is read from and written to the storage medium 170 via the magnetic head 180 mounted on the positioning arm 185. The actuator motor 190 comprises a permanent magnet and a moving coil motor, which operate to controllably swing the magnetic head 180 into a desired position across the magnetic surface of the storage medium 170 as the storage medium 170 spins by operation of the spindle motor 160.

In general, a sequence of magnetic flux transitions corresponding to a digital data sequence are written onto the magnetic surface of the storage medium 170 using the magnetic head 180. The digital data sequence serves to modulate current in the write coil of the magnetic head 180. The magnetic surface of storage medium 170 comprises a plurality of concentric tracks, wherein each track is subdivided into a plurality of sectors that are capable of storing a block of sector data for subsequent retrieval. Moreover, the storage medium 170 further comprises timing patterns formed on the surface thereof, which comprise one or more sets of servo address marks (SAMs) or other types of servo marks formed in particular sectors in a conventional manner.

The host interface connector 118 represents a physical connector and associated input/output (I/O) bus wiring that connects the storage device 10 to a host system, device, I/O bus, or other components of a data processing system. The I/O data is moved to and from the storage device 10 through the host interface connector 118 under control of the host interface controller 104. The host interface controller 104 implements communication protocols for communicating with a host system or device and controlling and managing data I/O operations, using one or more known interface standards. For example, in one or more alternative embodiments of the invention, the host interface connector 118 and the host interface controller 104 are implemented using one or more of: Small Computer interface (SCSI), Serial Attached SCSI (SAS), Serial Advanced Technology Attachment (SATA) and/or Fibre Channel (FC) interface standards, for example.

The hard disk controller 102 controls the overall operations of writing and reading data to and from the storage medium 170. In one embodiment of the invention, the hard disk controller 102 is a programmable microprocessor or microcontroller. In other embodiments, the hard disk controller 102 may be implemented using other known architectures that are suitable for controlling hard disk operations. The recording channel circuitry 110 encodes and decodes data that is written to and read from the storage medium 170 using the magnetic head 180. The recording channel circuitry 110 comprises various types of circuitry that are commonly implemented in a recording channel to process data that is read from and written to the storage medium 170, the details of which are not necessary to one of ordinary skill in the art for understanding embodiments of the invention as discussed herein.

The preamplifier circuitry 130 is connected between the recording channel circuitry 110 and the magnetic head 180. In one embodiment, the preamplifier circuitry 130 is disposed proximate to a pivot location of the actuator motor 190. Flexible printed-circuit cables are used to connect the magnetic head 180 to the preamplifier circuitry 130. The preamplifier circuitry 130 amplifies an analog signal output from the magnetic head 180 for input to the recording channel circuitry 110 and provides a bias voltage for driving the read sensors of the magnetic head 180.

The motor controller 106 is connected to the head/disk assembly 150 via the servo interface 122. The motor controller 106 sends control signals to the spindle motor 160 and actuator motor 190 through the servo interface 122 during read and write operations to spin the storage medium 170 and move the magnetic head 180 into a target position. In particular, for a typical read operation, read command signals for performing a read operation are received through the host interface connector 118 and sent to the hard disk controller 102 through the host interface controller 104 over the internal bus 116. The hard disk controller 102 processes the read command signals for performing the read operation and then sends control signals to the motor controller 106 for controlling the actuator motor 190 and spindle motor 160 for the read operation. Additionally, the hard disk controller 102 sends the processed read signals to the recording channel circuitry 110, which are then sent to the actuator motor 190 through the preamplifier circuitry 130 to perform the read operation. The actuator motor 190 positions the magnetic head 180 over a target data track on storage medium 170 in response to control signals received by the motor controller 106 and the recording channel circuitry 110. The motor controller 106 also generates control signals to drive the spindle motor 160 to spin the storage medium 170 under the direction of the hard disk controller 102. The spindle motor 160 spins the storage medium 170 at a determined spin rate.

When the magnetic head 180 is positioned adjacent a target data track, magnetic signals representing data on the storage medium 170 are sensed by magnetic head 180 as the storage medium 170 is rotated by the spindle motor 160. The sensed magnetic signals are provided as continuous, minute analog signals (read back signals) representative of the magnetic data on the storage medium 170. The analog read back signals are transferred from the magnetic head 180 to the recording channel circuitry 110 via the preamplifier circuitry 130. The preamplifier circuitry 130 amplifies the analog read back signals accessed from storage medium 170, and the recording channel circuitry 110 decodes and digitizes the amplified analog read back signals to recreate the information originally written to the storage medium 170. The data read from the storage medium 170 is then output to a host system or device through the host interface controller 104 and host interface connector 118 under control of the hard disk controller 102. A write operation is substantially the opposite of a read operation. For example, in one embodiment, write data and command signals for performing write operations are received through the host interface connector 118, wherein the write signals represent commands to perform a write operation and/or data that is to be written to the storage medium 170. The write signals are sent to the hard disk controller 102 through host interface controller 104. The hard disk controller 102 processes the write signals for performing the write operation and then sends control signals to the motor controller 106 for controlling the actuator motor 190 and spindle motor 160 for the write operation. Additionally, the hard disk controller 102 sends the processed write signals (and formatted data) to the recording channel circuitry 110, wherein the formatted data to be written is encoded. The write signals (control and data) are then sent to the head/disk assembly 150 via the preamplifier circuitry 130 to perform a write operation by writing data to the storage medium 170 via the magnetic head 180.

In the embodiment of FIG. 1, the random access memory 140, the buffer memory 114, the memory controller 108, and the memory bus 120 are configured to perform or otherwise support data caching and buffering functions that are typically implemented in data storage devices, as well as store and enable access to firmware sequences that control operation of the hard disk controller 102 and other components connected thereto. The random access memory 140 is an external memory relative to the system-on-chip 100 and other components of the storage device 10, but is nonetheless internal to the storage device 10. In one embodiment, the external random access memory 140 is a double data rate synchronous dynamic random access memory, although a wide variety of other types of memory may be used in alternate embodiments.

It is to be understood that the external random access memory 140, system-on-chip 100 and preamplifier circuitry 130 shown in FIG. 1 collectively represent one embodiment of "control circuitry" as that term is utilized herein. Numerous alternative embodiments of "control circuitry" include a subset of the components 100, 130 and 140 or portions of one or more of these components. For example, the system-on-chip 100 itself may be viewed as an example of "control circuitry" to process data received from and supplied to the magnetic head 180 and to control positioning of the magnetic head 180 relative to the storage medium 170. Certain operations of the system-on-chip 100 in the storage device 10 of FIG. 1 may be directed by the hard disk controller 102, which executes code stored in the external random access memory 140 and/or the buffer memory 114, for example. Thus, at least a portion of the control functionality of the storage device 10 may be implemented at least in part in the form of software code.

Furthermore, although the embodiment of FIG. 1 illustrates various components of the system-on-chip 100 being implemented on a single integrated circuit chip, the system-on-chip 100 may include other integrated circuits, such as the external random access memory 140 or the preamplifier circuitry 130, or portions thereof. Moreover, the hard disk controller 102, host interface controller 104, motor controller 106, and synchronous serial port control circuitry 112 may be implemented using suitable integrated circuit architectures such as microprocessor, digital signal processor (DSP), application-specific integrated circuit (ASIC), or field-programmable gate array (FPGA), or other types of integrated circuit architectures.

While FIG. 1 shows an embodiment of the invention with a single instance of each of the storage medium 170, magnetic head 180, and positioning arm 185, it is to be understood that in an alternate embodiment of the invention, the storage device 10 comprises multiple instances of one or more of these or other drive components. For example, in an alternative embodiment of the invention, the storage device 10 comprises multiple storage disks attached to the same spindle such that each storage disk rotates at the same speed, as well as multiple magnetic read/write heads and associated positioning arms coupled to one or more actuators. Moreover, it is to be understood that a read/write head as that term is broadly used herein may be implemented in the form of a combination of separate read and write heads. More particularly, the term "read/write" as used herein is intended to be construed broadly as read and/or write, such that a read/write head may comprise one or more read heads only, one or more write heads only, a single head used for both reading and writing, or a combination of separate read and write heads. Such heads may comprise, for example, write heads with wrap-around or side-shielded main poles, or any other types of heads suitable for recording and/or reading data on a storage disk.

In addition, the storage device 10 as illustrated in FIG. 1 may include other elements in addition to, or in place of, those specifically shown, including one or more elements of a type commonly found in conventional storage devices. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other storage device configurations may be used in implementing embodiments of the invention.

Figure 2:
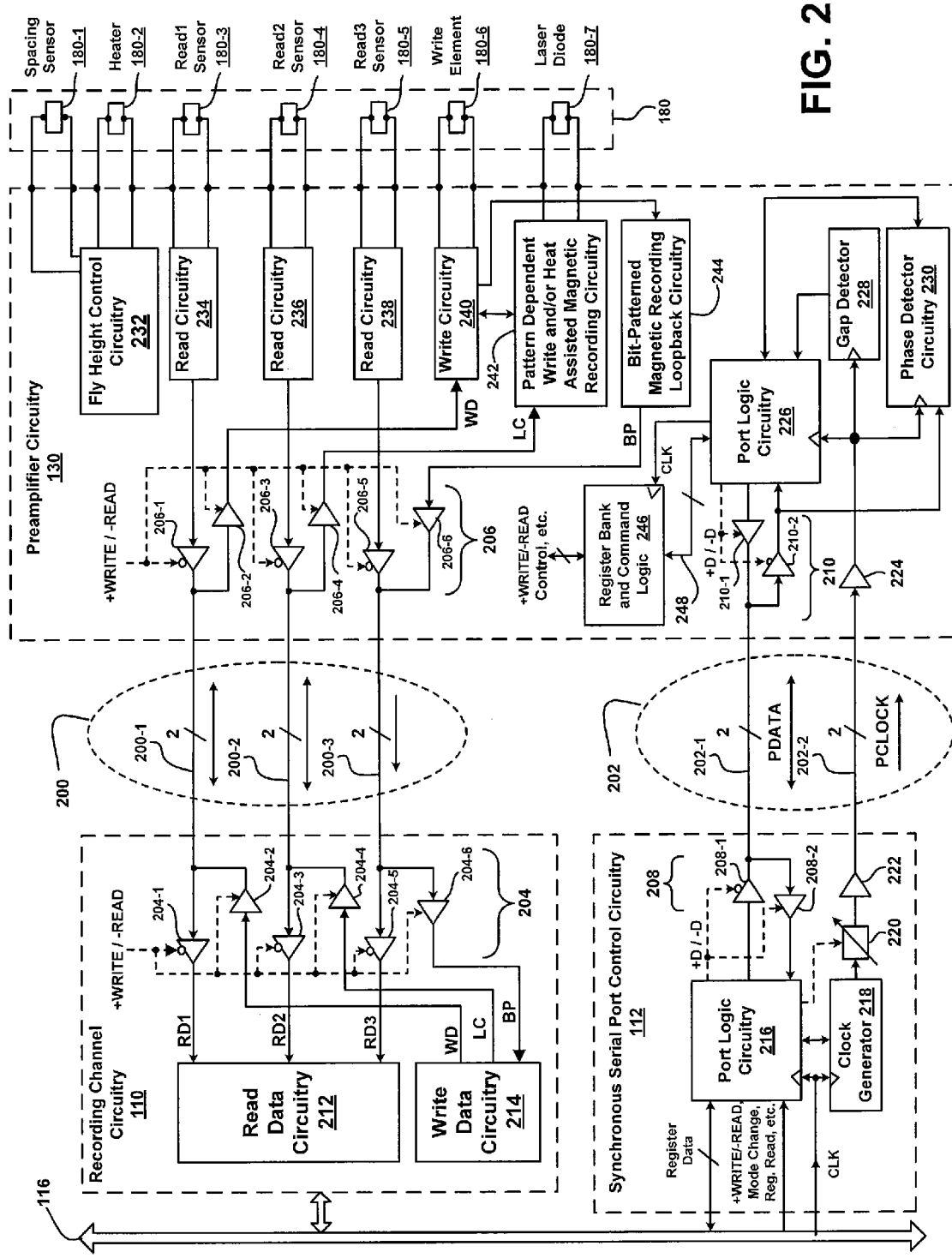
FIG. 2 is a schematic block diagram that illustrates a more detailed embodiment of the storage device of FIG. 1 having circuitry to support multiplexed communication in a storage device according to an embodiment of the invention.

FIG. 2 is a schematic block diagram that illustrates a more detailed embodiment of the storage device of FIG. 1 having circuitry to support multiplexed communication in a storage device according to an embodiment of the invention. More specifically, FIG. 2 illustrates detailed embodiments of the recording channel circuitry 110, the synchronous serial port control circuitry 112, the preamplifier circuitry 130, the magnetic head 180, the analog bus 200, and the digital bus 202, which are configured to support multiplexed communication in the storage device 10 of FIG. 1.

As shown in FIG. 2, the analog bus 200 comprises a plurality of analog signal lines 200-1, 200-2, and 200-3. In one embodiment of the invention, as depicted in FIG. 2, the analog signal lines 200-1, 200-2, and 200-3 are implemented as differential signal lines to assure noise immunity and signal quality of analog signals (or digital signals) that are transmitted over the analog bus 200 between the recording channel circuitry 110 and the preamplifier circuitry 130. In other embodiments, the analog signal lines 200-1, 200-2, and 200-3 are implemented as single wires, or other types of signal lines that are suitable for the given application. The recording channel circuitry 110 and the preamplifier circuitry 130 comprise multiplexing circuitry 204/206 which, as explained in further detail below, is configured to control multiplexed transmission of read and write information signals (control and/or data signals) over the plurality of analog lines 200-1, 200-2, and 200-3 of the analog bus 200 between the recording channel circuitry 110 and the preamplifier circuitry 130.

Moreover, the digital bus 202 consists of a bidirectional serial data line 202-1, and a unidirectional clock signal line 202-2, which are connected between the synchronous serial port control circuitry 112 and the preamplifier circuitry 130. In one embodiment of the invention, as depicted in FIG. 2, the bidirectional serial data line 202-1 and the clock signal line 202-2 are implemented as differential signal lines so as to enable the transmission of high-rate data streams that are used to transmit digital signals (control data and commands) over the bidirectional serial data line 202-1, as well as transmit an associated high-frequency synchronous clock signal over the clock signal line 202-2. In other embodiments, the digital bus 202 can be implemented with single wires, or other types of signal lines that are suitable for the given application. The synchronous serial port control circuitry 112 and the preamplifier circuitry 130 comprise multiplexing circuitry 208/210 which, as explained in further detail below, is configured to control bidirectional, multiplexed transmission of digital signals over the bidirectional serial data line 202-1 of the digital bus 202. Unidirectional clock signal line 202-2 is provided to a circuit 224 of preamplifier circuitry 130.

As further shown in FIG. 2, the recording channel circuitry 110 comprises read data circuitry 212 and write data circuitry 214. In addition, the synchronous serial port control circuitry 112 comprises port logic circuitry 216, a clock generator 218, alignment circuitry 220, and a driver 222. Moreover, the preamplifier circuitry 130 comprises port logic circuitry 226, a gap detector circuit 228, phase detector circuitry 230, fly height control circuitry 232, read circuitry 234, 236 and 238, write circuitry 240, pattern dependent write circuitry and/or heat assisted magnetic recording circuitry 242, bit-patterned magnetic recording loopback circuitry 244, and register bank and command logic circuitry 246. The magnetic head 180 comprises a spacing sensor 180-1, a heater element 180-2, a plurality of read sensors 180-3, 180-4 and 180-5, a write element 180-6, and a laser diode 180-7. The various components of the magnetic head 180 can be implemented using structures and techniques that are well known in the art and consequently, a detailed explanation of such components is not necessary for understanding embodiments of the invention.

In general, the read circuits 234, 236, and 238 and respective read sensors 180-3, 180-4, and 180-5 are configured to read and process magnetic signals that represent data stored on the storage medium 170. The read sensors 180-3, 180-4, and 180-5 are configured to sense magnetic signals that exist on the storage medium 170, and output the sensed magnetic signals as continuous, minute analog signals (read back signals) representative of the data that is stored on the storage medium 170. The read circuits 234, 236, and 238 include circuitry such as sensor bias sources to support the read sensors 180-3, 180-4 and 180-5, as well as low noise amplifiers to amplify the analog signals output from the read sensors 180-3, 180-4 and 180-5. The read circuits 234, 236, and 238 may include other circuitry that is commonly implemented to process read back signals.

FIG. 2 depicts an embodiment of a multi-dimensional recording system in which two or more read sensors are active during a read operation. Multi-dimensional recording techniques such as TDMR (Two Dimensional Magnetic Recording) have been developed to support higher bit densities in magnetic recording systems. With TDMR systems, two or more read heads are used to read the same track (and adjacent tracks) with a certain read offset, affording a degree of interference cancellation. TDMR enables the use of effective coding and signal processing algorithms that allow data bits to be stored at higher densities on a magnetic storage disk, and retrieved and decoded with acceptable error rates. In the example embodiment of FIG. 2, each of the three read sensors 180-3, 180-4, and 180-5 are active during a read operation, thereby outputting multiple read back signals RD1, RD2, and RD3, which are concurrently transmitted from the preamplifier circuitry 130 to the recording channel circuitry 110 over the analog bus 200.

In the recording channel circuitry 110, the read data circuitry 212 concurrently receives and processes the read back signals RD1, RD2, and RD3. The read data circuitry 212 comprises various types of circuitry for conditioning and digitizing the analog read back signals RD1, RD2, and RD3, and extracting a digital representation of the originally recorded data. For example, the read data circuitry 212 comprises analog front-end circuitry for analog signal processing the read back signals RD1, RD2, and RD3 received from the preamplifier circuitry 130 using well known circuits and analog signal processing techniques. Moreover, the read data circuitry 212 further comprises analog-to-digital converter circuitry that digitizes the analog signals, and other circuitry such as data equalization circuitry, data detection circuitry, data decoding circuitry, data deserialization circuitry, clock recovery circuitry, and other types of circuitry that is commonly included in recording channels for processing and decoding the digitized read back signals and recreating the digital data originally written to the storage medium, the details of which are not necessary for understanding embodiment of the invention described herein.

The write data circuitry 214 in the recording channel circuitry 110 is configured to receive over the internal bus 116 data which is to be written to the storage medium 170, deserialize the write data, and then encode, write precompensate, and otherwise transform the write data into a form that can be recorded on the storage medium 170. The write data circuitry 214 outputs encoded write data WD for transmission to the preamplifier circuitry 130 over the analog bus 200. In the preamplifier circuitry 130, the write circuitry 240 receives the encoded write data WD and further processes the encoded write data WD, as desired, for recording on the storage medium 170. The write circuitry 240 is further configured to drive the write element 180-6 in the magnetic head 180 for recording the write data WD on the storage medium 170.

The pattern dependent write and/or heat assisted magnetic recording circuitry 242 (alternatively referred to individually as HAMR (heat-assisted magnetic recording) circuitry 242 or PDW (pattern dependent write) circuitry 242) are circuits that are optionally included in the preamplifier circuitry 130. Control and/or data signals that are used for controlling the pattern dependent write and/or heat assisted magnetic recording circuitry 242 are transmitted from the recording channel circuitry 110 to the preamplifier circuitry 130 over the analog bus 200. As is known in the art, HAMR is an advanced recording technology that enables a large increase in the storage density of hard disk drives. HAMR magnetically records data on a magnetic storage disk using a laser to heat the magnetic material of the magnetic storage disk before writing data to the magnetic storage disk, thus allowing the writer to magnetize high-coercivity media.

As depicted in FIG. 2, a laser clock signal LC for controlling a HAMR operation is generated by the write data circuitry 214 and transmitted to the HAMR circuitry 242 over the analog bus 200. In the example embodiment of FIG. 2, the HAMR circuitry 242 uses the laser clock signal LC to generate a laser pulse signal at the transition rate of the magnetic write data WD to be recorded. The laser diode 180-7 is pulsed by the laser clock signal LC in synchronization with the data bits as the data bits are written to the magnetic storage disk by operation of the write element 180-6, thereby temporarily heating a recording area of the magnetic storage medium 170 as data bits are written. This heating process allows the write element 180-6 to more easily switch the magnetic orientation on the surface of the magnetic storage disk to store the data bits. In one embodiment of the invention, the HAMR circuitry 242 is implemented using the circuits and methods as disclosed in U.S. patent application Ser. No. 13/096,900, filed on Apr. 28, 2011, entitled Systems and Methods for Laser Write Control, which is commonly assigned and incorporated herein by reference.

The PDW circuitry 242 is configured to generate a pattern dependent write control signal based on (i) a pattern in the write data WD that is received by the write circuitry 240 and (ii) an associated clock signal that is generated by the write data circuitry 214 and transmitted to the preamplifier circuitry 130 over the analog bus 200. The PDW circuitry 242 is configured to set a write current level (in the write element 180-6) to one of a plurality of different current levels based on the pattern dependent write control signal generated by the PDW circuitry 242. The write data WD is then recorded on the magnetic storage medium 170 using a write current through the write element 180-6 which has a level (amplitude) that is set based on the pattern dependent write control signal. The PDW process essentially modulates the write current that is used in the write element 180-6 to record the write data WD on the magnetic storage medium 170, thereby compensating for magnetic effects which would otherwise degrade the written magnetic signal. In one embodiment of the invention, the PDW circuitry 242 is implemented using the circuits and methods as disclosed in U.S. patent application Ser. No. 13/302,169, filed on Nov. 22, 2011, entitled Magnetic Recording System With Multi-Level Write Current, which is commonly assigned and incorporated by reference herein. In another embodiment of the invention, the PDW circuitry 242 is implemented using the circuits and methods as disclosed in U.S. patent application Ser. No. 14/085,816, filed on Nov. 21, 2013, entitled Storage System With Pattern Dependent Write, which is commonly assigned and incorporated herein by reference.

The bit-patterned magnetic recording loopback circuitry 244 provides support for embodiments in which the storage medium 170 is implemented using patterned media. With patterned media technology, data is recorded in magnetic islands formed on the storage disk—a single data bit per island. This is in contrast to hard disk drive technologies in which each data bit is stored in multiple grains (e.g., 20-30 magnetic grains) within a continuous magnetic film. With bit-patterned media recording techniques, each data bit is written on a small nanometer-sized magnetic island as the disk spins. With this recording mechanism, precision timing is needed to correctly write each bit on a respective magnetic island. In the example embodiment of FIG. 2, the bit-patterned magnetic recording loopback circuitry 244 is configured to generate a loop back signal BP that is sent from the preamplifier circuitry 130 to the recording channel circuitry 110 over the analog bus 200. The write data circuitry 214 processes the loopback signal BP to stabilize system timing for a bit-patterned recording process (e.g., ensure that phase of digital write signal is properly aligned to data bits of write data WD).

The fly height control circuitry 232 is configured to controllably adjust the spacing (or fly height) between the magnetic head 180 and the surface of the storage medium 170. In general, the fly height control circuitry 232, spacing sensor 180-1, and heater element 180-2 are configured to cooperate with elements of the recording channel circuitry 110 and firmware that is operative within the hard disk controller 102 to maintain a constant, low head-to-disk spacing that is needed for high-density recording. The fly height control circuitry 232 generates and regulates either a programmed power level or voltage to the heater element 180-2 to control the heating of a region of the magnetic head 180 (the "sensor region") which contains the spacing sensor 180-1, the read sensors 180-3, 180-4, and 180-5, and the write element 180-6. The heating of the sensor region causes the sensor region to bulge and thereby move the spacing sensor 180-1, the read sensors 180-3, 180-4, and 180-5, and the write element 180-6 closer to the surface of the storage medium 170. The spacing sensor 180-1 generates a sensor current which increases as the spacing sensor 180-1 approaches the surface of the storage medium 170. The sensor current generated by the spacing sensor 180-1 is processed by the fly height control circuitry 232 to control the heater actuation process and, thus, control the spacing between the magnetic head 180 and the surface of the storage medium 170.

In the embodiment shown in FIG. 2, the read data RD1, RD2, and RD3, the write data WD, and the control signals LC and BP are transmitted over the analog bus, 200 using a multiplexing interface that is implemented using the multiplexing circuitry 204/206. The multiplexing circuitry 204/206 allows the read data RD1, RD2, and RD3, the write data WD, and the control signals LC and BP to share the analog signal lines of the analog bus 200 connecting the recording channel circuitry 110 and the preamplifier circuitry 130 so that the number of analog lines needed is less than the total number of different signals transmitted between the recording channel circuitry 110 and the preamplifier circuitry 130. This is in contrast to conventional storage systems in which each signal is transmitted between a recording channel and a preamplifier on a dedicated unidirectional signal line. In the embodiment of FIG. 2, the various signals RD1, RD2, RD3, WD, LC, and BP are transmitted over a set of shared (multiplexed) bidirectional or unidirectional signal lines, wherein the multiplexing (sharing) and transmission direction of a given line is determined based on whether a given recording operation is a read operation or a write operation.

In particular, in the embodiment of FIG. 2, the multiplexing circuitry 204/206 comprises switching circuitry 204 located at one end of the analog bus 200, and switching circuitry 206 located at an opposite end of the analog bus 200. The switching circuitry 204 comprises a plurality of switches 204-1, 204-2, 204-3, 204-4, 204-5, and 204-6. The switching circuitry 206 comprises a plurality of switches 206-1, 206-2, 206-3, 206-4, 206-5, and 206-6. As depicted in the example embodiment of FIG. 2, the switches 204-1, 204-2, 206-1, and 206-2 control bidirectional transmission of multiplexed signals (e.g., read data RD1 and write data WD) over the first analog signal line 200-1. Moreover, the switches 204-3, 204-4, 206-3, and 206-4 control bidirectional transmission of multiplexed signals (e.g., read data RD2 and control signal LC) over the second analog signal line 200-2. Further, the switches 204-5, 204-6, 206-5, and 206-6 control transmission of multiplexed signals (read data RD3 and control signal BP) over the third analog signal line 200-3.

As depicted in FIG. 2, the multiplexing circuitry 204/206 is controlled by a write gate control signal (denoted +WRITE/−READ), which enables or disables the various switches depending on the logic level of the write gate control signal. For example, in the embodiment of FIG. 2, during a read operation, the write gate control signal is set to logic "0", which enables the switches 204-1, 204-3, 204-5, 206-1, 206-3 and 206-5, and which disables the switches 204-2, 204-4, 204-6, 206-2, 206-4, and 206-6. Thus, during a read operation, the read data RD1, RD2, and RD3 are concurrently transmitted over respective analog lines 200-1, 200-2 and 200-3 of the analog bus 200 from the preamplifier circuitry 130 to the recording channel circuitry 110.

On the other hand, during a write operation, the write gate control signal is set to logic "1", which disables the switches 204-1, 204-3, 204-5, 206-1, 206-3 and 206-5, and which enables the switches 204-2, 204-4, 204-6, 206-2, 206-4, and 206-6. Therefore, during a write operation, the write data WD and control signal LC are transmitted over respective analog lines 200-1 and 200-2 of the analog bus 200 from the recording channel circuitry 110 to the preamplifier circuitry 130, and the control signal BP is transmitted over the analog line 200-3 from the preamplifier circuitry 130 to the recording channel circuitry 110.

In the embodiment of FIG. 2, the first analog line 200-1 is implemented as a multiplexed bidirectional line as follows. During a read operation, a first input of the read data circuitry 212 is switchably connected to the first analog line 200-1 (via the enabled switch 204-1) to receive read data RD1 transmitted from the preamplifier circuitry 130 over the first analog line 200-1. On the other hand, during a write operation, a write data output of the write data circuitry 214 is switchably connected to the first analog line 200-1 (via the enabled switch 204-2) to transmit write data WD from the recording channel circuitry 110 over the first analog line 200-1.

Moreover, the second analog line 200-2 is implemented as a multiplexed bidirectional line as follows. During a read operation, a second input of the read data circuitry 212 is switchably connected to the second analog line 200-2 (via the enabled switch 204-3) to receive read data RD2 transmitted from the preamplifier circuitry 130 over the second analog line 200-2. On the other hand, during a write operation, a write control output of the write data circuitry 214 is switchably connected to the second analog line 200-2 (via the enabled switch 204-4) to transmit a write control signal (e.g., laser clock signal LC) to the preamplifier circuitry 130 over the second analog line 200-2.

Further, the third analog line 200-3 is implemented as a multiplexed unidirectional line as follows. During a read operation, a third input of the read data circuitry 212 is switchably connected to the third analog line 200-3 (via the enabled switch 204-5) to receive read data RD3 transmitted from the preamplifier circuitry 130 over the third analog line 200-3. On the other hand, during a write operation, a write control input of the write data circuitry 214 is switchably connected to the third analog line 200-3 (via the enabled switch 204-6) to receive a write control signal (e.g., loop back control signal BP) transmitted from the preamplifier circuitry 130 over the third analog line 200-3.

In general, the digital bus 202 is controlled by the synchronous serial port control circuitry 112 and the port logic circuitry 226 in the preamplifier circuitry 130. The port logic circuitry 216 (master) in the synchronous serial port control circuitry 112 operates in conjunction with the port logic circuitry 226 (slave) in the preamplifier circuitry 130 to control multiplexed, bidirectional transfer of digital signals (PDATA) over the bidirectional serial data line 202-1 of the digital bus 202. In particular, the multiplexing circuitry 208/210 comprises switching circuitry 208 located at one end of the bidirectional serial data line 202-1, and switching circuitry 210 located at an opposite end of the bidirectional serial data line 202-1. The switching circuitry 208 comprises switches 208-1 and 208-2, and the switching circuitry 210 comprises switches 210-1 and 210-2.

As depicted in FIG. 2, the multiplexing circuitry 208/210 is controlled by a direction control signal (denoted +D/−D), which enables or disables the various switches depending on the logic level of direction control signal. For example, to transmit PDATA in an "outbound" direction (from the synchronous serial port control circuitry 112 to the preamplifier circuitry 130), the direction control signal +D/−D is set to logic "0", which enables the switches 208-1 and 210-2, and which disables the switches 208-2 and 210-1. On the other hand, to transmit PDATA in an "inbound" direction (to the synchronous serial port control circuitry 112 from the preamplifier circuitry 130), the direction control signal +D/−D is set to logic "1", which disables the switches 208-1 and 210-2, and which enables the switches 208-2 and 210-1.

The bidirectional serial data line 202-1 and associated clock signal line 202-2 provide a high-speed bidirectional synchronous serial port framework which is utilized to perform all preamplifier register setup and interrogation operations, as well as functions traditionally performed by dedicated bit-significant lines and other dedicated serial port control lines to control register access and sequencing functions in the preamplifier circuitry 130.

The port logic circuitry 216 (master) and port logic circuitry 226 (slave) operate the bidirectional serial data line 202-1 of the digital bus 202 in essentially a mater/slave manner to transmit digital information signals back and forth between the synchronous serial port control circuitry 112 and preamplifier circuitry 130. The port logic circuitry 216 (master) receives digital information signals (data and control) from the internal bus 116 including, for example, register data, mode control signals, register read commands, fly height control data, etc., and the port control circuitry 216 (master) transmits register setup information, read/write mode signals, and fly height-heater demand signals, for example, in an "outbound" direction to the preamplifier circuitry 130 over the bidirectional serial data line 202-1. On the other hand, the port control circuitry 226 (slave) transmits, e.g., register read results, fault polling, and head/disc spacing (fly height) information, and other information discussed below, in an "inbound" direction to the synchronous serial port control circuitry 112 over the bidirectional serial data line 202-1.

Moreover, the clock generator 218 generates a synchronous clock signal (PCLOCK) that is transmitted on the clock signal line 202-2 of the digital bus 202 from the synchronous serial port control circuitry 112 to the preamplifier circuitry 130 to synchronize transfer and processing of the digital signals (PDATA) transmitted on the bidirectional serial data line 202-1 of the digital bus 202. The PCLOCK signal transmitted on the clock signal line 202-2 is used by preamplifier circuitry 130 to control timing of sequence control functions that are implemented by, e.g., the port logic circuitry 226, the gap detector circuit 228, the phase detector circuit 230, etc. The clock generator 218 generates the PCLOCK signal based on a clock signal CLK that is received over the internal bus 116. The clock signal CLK is also used to control sequencing functions in the port logic circuitry 216. The clock signal CLK can be an external clock signal generated by a PLL (phase locked loop) circuit implemented by a microprocessor. The clock signal CLK can be fixed or programmable. Moreover, since the synchronous serial port is fully synchronous, the PCLOCK signal can be paused at any time consistent with the required port activity and the potential use of PCLOCK as the master clock in the sequencing logic of the preamplifier circuitry 130.

In response to a control signal from the port logic circuitry 216, the clock generator 218 is configured to temporarily disable generation of clock pulses of the PCLOCK signal for a given period of time so as to insert a "gap" within the PCLOCK signal stream. The gap detector circuit 228 in the preamplifier circuitry 130 is configured to detect a gap in the PCLOCK signal stream. In one embodiment of the invention as discussed in further detail below with reference to FIG. 7, for example, the "gap" within the PCLOCK signal stream is used as a direction switch control signal that instructs the port logic circuitry 226 to gain control of the bidirectional serial data line 202-1 to transmit digital information to the synchronous serial port control circuitry 112. In another embodiment of the invention as discussed in further detail with reference to FIG. 10, for example, the "gap" within the PCLOCK signal stream is used as a reset control signal that instructs the preamplifier circuitry 130 to perform a reset operation to reset the preamplifier circuitry 130.

Moreover, the clock generator 218 comprises circuitry for adjusting the frequency of the PCLOCK signal that is transmitted over the clock signal line 202-2. For example, the clock generator 218 can generate a PCLOCK signal having a high frequency (e.g., 1-2 GHz) for use in synchronizing high-rate transmission of digital PDATA streams to the preamplifier circuitry 130 under normal operating conditions. The clock generator 218 comprises circuitry (e.g., clock divider circuitry) for throttling down the frequency of the PCLOCK signal to a lower frequency (e.g., 100 MHz) in instances where it is desired to synchronizing low-rate transmission of digital PDATA streams between the synchronous serial port control circuitry 112 and the preamplifier circuitry 130 to enable reliable communication.

For example, in one embodiment of the invention, the PCLOCK signal is throttled down to a lower frequency during a "skew measurement" process that is implemented by the synchronous serial port control circuitry 112 and preamplifier circuitry 130 operating in collaboration to measure a time skew between PDATA and PCLOCK signals transmitted on the bidirectional serial data line 202-1 and the clock signal line 202-2 of the digital bus 202, and phase aligning the PDATA and PCLOCK signal streams based on skew measurement results. The preamplifier circuitry 130 comprises skew measurement circuitry that is collectively implemented by the port logic circuitry 226 and phase detector circuitry 230 to perform a skew measurement process and transmit the skew measurement results to the port logic circuitry 216 (master). Based on the skew measurement results, the port logic circuitry 216 controls the alignment circuitry 220 to adjust the phase of PCLOCK signal to vary the alignment of the PCLOCK signal (transmitted on the clock signal line 202-2) with the digital PDATA stream (transmitted on the bidirectional serial data line 202-1).

In one embodiment of the invention, the frequency of the PCLOCK signal is throttled down (by operation of the clock generator 218) so that the port logic circuitry 226 (slave) can reliably detect the measure skew control signal transmitted on the bidirectional serial data line 202-1 from the synchronous serial port control circuitry 112, and so that the port logic circuitry 216 (master) can reliably detect the skew measurement result transmitted from the preamplifier circuitry 130 on the bidirectional serial data line 202-1. Example embodiments of the skew measurement process and related circuitry will be discussed in further detail below with reference to FIGS. 8, 9, and 10, for example.

The port logic circuitries 216 and 226 include type of logic circuits to perform their respective functions. For example, the port logic circuitries 216 and 226 each comprise serializer/deserializer (SerDes) circuitry to serialize digital data that is transmitted over the bidirectional serial data line 202-1, and to parallelize digital data that is received over the bidirectional serial data line 202-1. For example, blocks of parallel register data received by the port logic circuitry 216 over the internal bus 116 are converted to serial register data for transmission to the preamplifier circuitry 130 over the bidirectional serial data line 202-1 of the digital bus 202.

Moreover, the port logic circuitries 216 and 226 include encoder and decoder circuits to encode and decode data that is transmitted on the bidirectional serial data line 202-1 based on a signal line code protocol implemented for the given application. For instance, in one embodiment of the invention, the PDATA can be transmitted on the bidirectional serial data line 202-1 using an 8 b/10 b coding protocol. As is known in the art, 8 b/10 b encoding is a protocol in which each eight-bit data byte is converted to a 10-bit transmission character. The encoding process provides 256 data characters, as well as 12 unique non-data control characters. Other line coding protocols may be implemented.

In the preamplifier circuitry 130, the register data is stored within register banks in the register bank and command logic circuitry 246. The register bank and command logic circuitry 246 is controlled by a clock signal CLK output from the port logic circuitry 226. The clock signal CLK can be a buffered version of the synchronous PCLOCK signal that is used to control sequencing operations of the port logic circuitry 226. The port logic circuitry 226 can send register data to the register bank and command logic circuitry over a parallel bus 248 for storage in one or more register banks. The port logic circuitry 226 can read/access register data that is stored in one or more register banks of the register bank and command logic circuitry 246 and transmit the read/accessed register data to the synchronous serial port control circuitry 112 over the bidirectional serial data line 202-1.

The register bank and command logic circuitry 246 comprises control circuitry to generate control signals that control operation of the various components 206, 232, 234, 236, 238, 240, 242 and 244 of the preamplifier circuitry 130 based on configuration data stored in the register banks, for example. Moreover, the register bank and command logic circuitry 246 can generate the write gate control signal (+WRITE/–READ) which is used to control the multiplexing circuitry 206.

Figure 3:
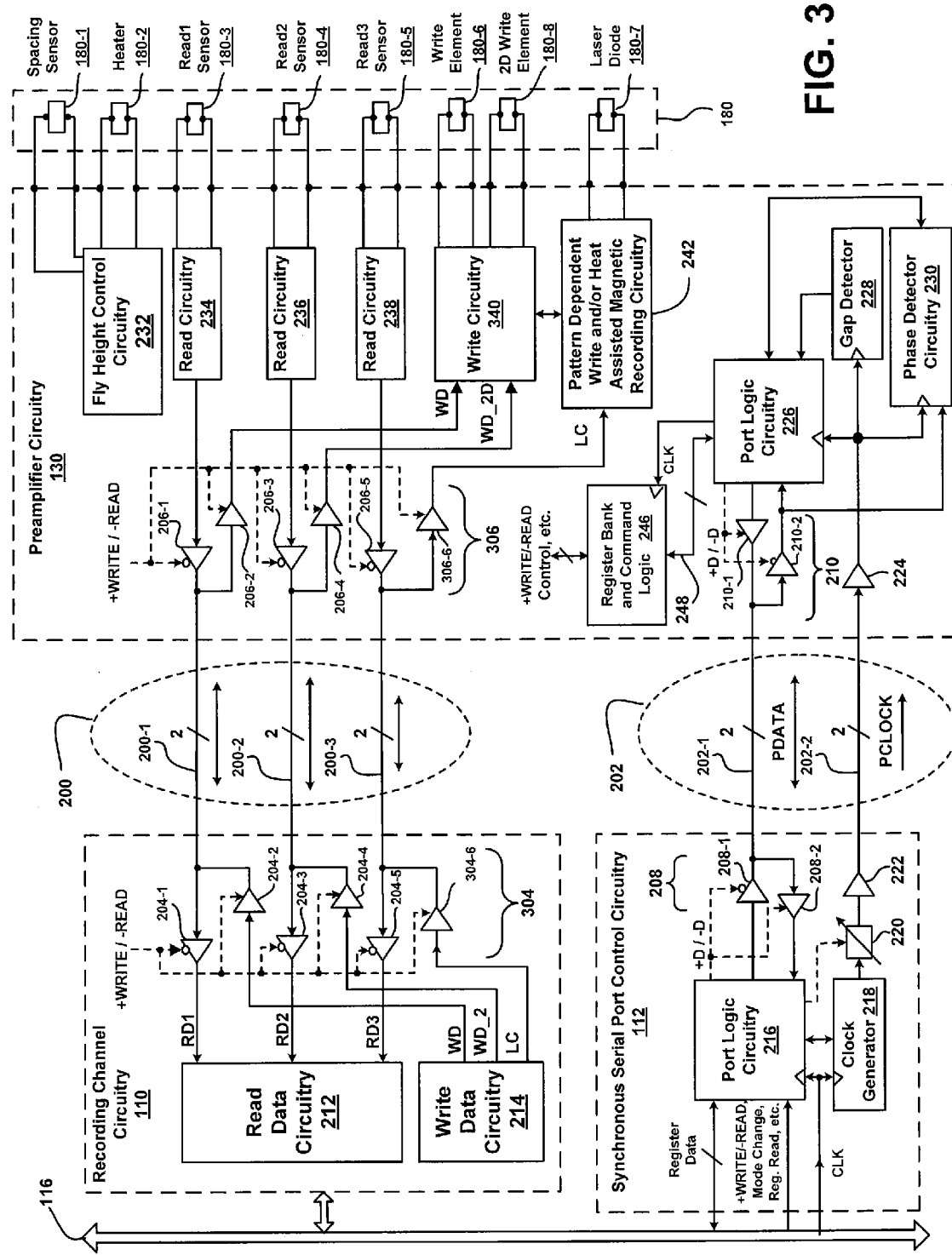
FIG. 3 is a schematic block diagram that illustrates a more detailed embodiment of the storage device of FIG. 1 having circuitry to support multiplexed communication in a storage device according to another embodiment of the invention.

It is to be understood that FIG. 2 is merely an illustrative embodiment to show different types of data and control signals that can be transmitted over multiplexed signal lines of the analog bus 200 and digital bus 202. The types of signals that are transmitted between the recording channel circuitry 110 and the preamplifier circuitry 130, and transmitted between the synchronous serial port control circuitry 112 and the preamplifier circuitry 130, will vary depending on the given application and particular implementation of the storage device. For example, FIG. 3 illustrates another embodiment of the storage device of FIG. 1, which comprises circuitry to support multiplexed communication in the storage device. FIG. 3 is similar to FIG. 2 except that the embodiment of FIG. 3 illustrates a multiplexing scheme to support two-dimensional encoded writing.

In particular, as depicted in FIG. 3, the write data circuitry 214 generates two write data signals WD and WD 2, which are transmitted (during a write operation) to write circuitry 340 in the preamplifier circuitry 130 over the first and second analog lines 200-1 and 200-2, respectively. The write circuitry 340 in the preamplifier circuitry 130 comprises circuitry for processing the write data WD and WD 2 and driving separate write elements 180-6 and 180-8 to write data on different tracks of the storage disk. A multi-dimensional encoding write protocol 15 as generally depicted in FIG. 3 enables the writing of different encoded data with different spectral content on adjacent tracks, which helps to distinguish the stored data on different tracks (in higher-storage density applications) and access the stored data with low BERs (bit error rates). As further depicted in FIG. 3, the third analog signal line 200-3 is implemented as a multiplexed bidirectional line (as compared to a multiplexed unidirectional line as depicted in FIG. 2), wherein read data RD3 is transmitted to the recording channel circuitry 110 over the third analog line 200-3 during a read operation, and wherein the write control signal LC is transmitted to the preamplifier circuitry 130 over the third analog line 200-3 during a write operation. Switching circuitry 304 includes a plurality of switches 204-1, 204-2, 204-3, 204-4, 204-5, and 304-6. Switching circuitry 306 includes a plurality of switches 206-1, 206-2, 206-3, 206-4, 206-5, and 306-6.

In each of the embodiments of FIGS. 2 and 3, the number of individual signal lines that are used in the analog bus 200 and digital bus 202 is less than a total number of information signals (control and data signals) that are transmitted between the preamplifier circuitry 130 and the recording channel circuitry 110, and between the synchronous serial port control circuitry 112 and the preamplifier circuitry 130. By way of specific example, with regard to the analog bus 200, FIG. 4 is a table that comparatively illustrates a number of signal lines needed for a non-multiplexed analog bus as compared to a number of signal lines used for a multiplexed analog bus according to alternate embodiments of the invention. In particular, FIG. 4 comparatively illustrates alternate embodiments for multiplexing read data, write data, and control signals for a three-channel multi-dimensional recording storage device.

As shown in FIG. 4, for a basic embodiment, a non-multiplexed scheme would require four (4) separate signal lines (e.g. four differential pairs) to transmit three read data signals RD1, RD2 and RD3 and one write data signal WD. In contrast, for a multiplexed scheme, the basic embodiment would utilize three (3) signal lines as the write data signal WD and read data signal RD1 could share the same signal line. As further shown in FIG. 4, for a basic embodiment with added pulsed HAMR or PDW, a non-multiplexed scheme would require five (5) separate signal lines (e.g., five differential pairs). In contrast, for a multiplexed scheme, the basic embodiment with added pulsed HAMR or PDW would utilize three (3) signal lines as the write data signal WD and read data signal RD1 could share the same signal line, and the control signal LC and read data signal RD2 could share the same signal line. Moreover, as further shown in FIG. 4, for a basic embodiment with added BPM and pulsed HAMR or PDW, a non-multiplexed scheme would require six (6) separate signal lines (e.g., six differential pairs). In contrast, for a multiplexed scheme, the basic embodiment with added BPM and pulsed HAMR or PDW would utilize three (3) signal lines as the write data signal WD and read data signal RD1 could share the same signal line, the control signal LC and read data signal RD2 could share the same signal line, and the control signal BP and read data signal RD3 could share the same signal line.

It is to be understood that a data storage device such as depicted in FIGS. 2 and 3 can implement both the analog bus 200 and digital bus 202 and associated multiplexing circuitries and control interfaces, as discussed herein. In another embodiment, a data storage device can implement either the analog bus 200 or the digital bus 202 (and associated multiplexing circuitry and control interface) exclusive, and independent from each other. For instance, the analog bus 200 and associated multiplexing circuitry 204/206 and control interface, as shown in FIGS. 2 and 3, can be used to implement multiplexed communication between the recording channel circuitry 110 and the preamplifier circuitry 130, while a conventional serial port architecture can be used to implement non-multiplexed communication between a controller and the preamplifier circuitry 130.

For example, the digital bus 202 (and associated multiplexing circuitry 208/210 and control interface) as shown in FIGS. 2 and 3 can be replaced with a conventional non-multiplexed three wire synchronous serial port comprising a (i) clock signal line, (ii) bidirectional serial data line, and an (iii) enable line to transmit setup and status monitoring information of configuration registers located in the preamplifier circuitry 130, together with one or more additional dedicated digital lines to transmit respective bit-significant control signals such as a mode control signal, a write gate control signal, and fault polling control signal, for example. By way of example, in this embodiment, the write gate (+WRITE/−READ) control signal shown in FIGS. 2 and 3 would not be transmitted on the bidirectional serial data line 202-1 of the digital bus 202. Instead, the write gate (+WRITE/−READ) control signal would be transmitted on a dedicated bit-significant line separate from the conventional three-wire serial port. Indeed, in a conventional communication scheme between a controller and preamplifier, digital functions such as write gate, fault polling and mode control functions requiring immediate attention, which cannot tolerate the polling and latency characteristics of a conventional serial port, would be transmitted on a bit-significant basis on an additional control bus comprising dedicated bit-significant control lines, separate from the serial port.

Figure 5:
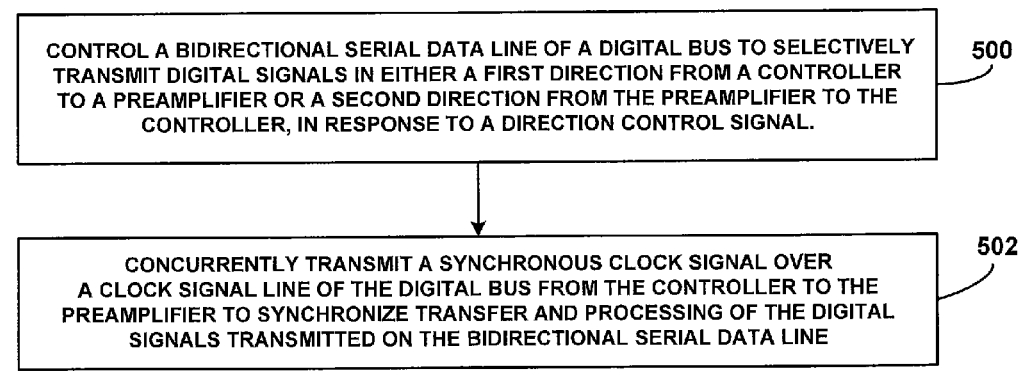
FIG. 5 is a flow diagram of a method to implement multiplexed communication between a controller and a preamplifier in a storage device using a digital bus comprising a single bidirectional serial data line and a single clock signal line, according to an embodiment of the invention.

Furthermore, in another embodiment of the invention, the analog bus 200 (and associated multiplexing circuitry 204/206 and control interface) as shown in FIGS. 2 and 3 can be replaced with a conventional non-multiplexed analog bus, while utilizing the two-wire, multiplexed synchronous serial port shown in FIGS. 2 and 3. In this embodiment, the non-multiplexed analog bus would have a dedicated signal line for each read back signal and write signal transmitted between the recording channel and preamplifier, such as shown in FIG. 4, for example. FIG. 5 is a flow diagram of a method to implement communication between a controller and a preamplifier in a storage device using a digital bus comprising a single bidirectional serial data line and a single clock signal line, according to an embodiment of the invention. In general, the method shown in FIG. 5 comprises controlling a bidirectional serial data line of a digital bus to selectively transmit digital signals in either a first direction from the controller to the preamplifier or a second direction from the preamplifier to the controller, in response to a direction control signal (block 500), while concurrently transmitting a synchronous clock signal over a clock signal line of the digital bus from the controller to the preamplifier to synchronize transfer and processing of the digital signals transmitted on the bidirectional serial data line of the digital bus (block 502). For purposes of illustration, the method of FIG. 5 will be discussed in further detail below with reference to the exemplary embodiment of FIGS. 2. 6, and 7, for example, in the context of controlling communication between the synchronous serial port control circuitry 112 and the preamplifier circuitry 130 over a synchronous serial port.

As noted above, the port logic circuitry 216 (master) in the synchronous serial port control circuitry 112 operates in conjunction with the port logic circuitry 226 (slave) in the preamplifier circuitry 130 to control multiplexed, bidirectional transfer of digital signals (PDATA) over the bidirectional serial data line 202-1 of the digital bus 202. Moreover, the port logic circuitry 216 controls the clock generator 218 to generate a synchronous clock signal PCLOCK that is transmitted over the clock signal line 202-2 of the digital bus 202 to control sequencing functions in preamplifier circuitry 130 (e.g., control the port logic circuitry 226, the gap detector circuit 228, the phase detector circuitry 230, etc.).

In accordance with embodiments of the invention, the transmission direction of PDATA is controlled by the synchronous serial port control circuitry 112 inserting direction control characters in either an outbound PDATA stream or in the PCLOCK signal. For example, FIGS. 6 and 7 are timing diagrams that illustrate methods to control a direction switch on a bidirectional serial data line according to alternate embodiments of the invention.

Figure 6:
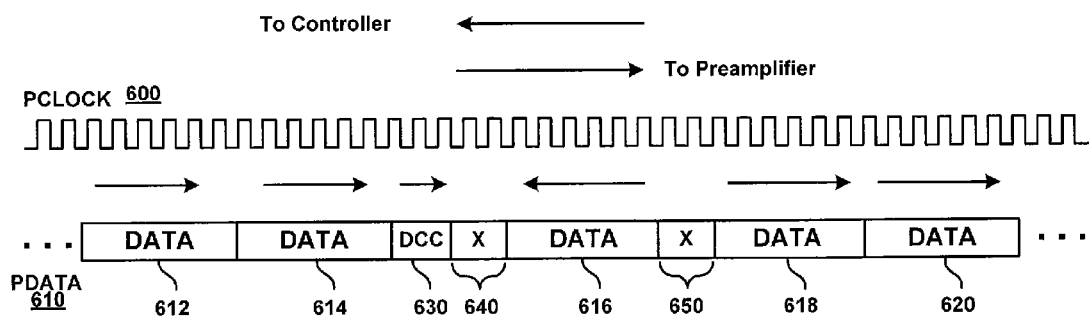
FIG. 6 is a timing diagram that illustrates a method to control a direction switch on a bidirectional serial data line of a digital bus, according to an embodiment of the invention.
Figure 7:
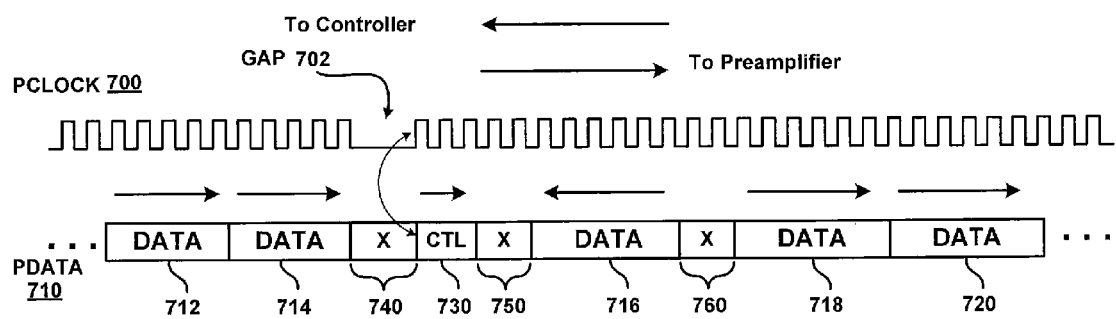
FIG. 7 is a timing diagram that illustrates a method to control a direction switch on a bidirectional serial data line of a digital bus, according to another embodiment of the invention.

In particular, FIG. 6 is a timing diagram that illustrates a method to control a direction switch on a bidirectional serial data line by inserting a direction control character in an outbound PDATA stream, according to an embodiment of the invention. In the context of the embodiment of FIG. 2, for example, FIG. 6 illustrates an example PCLOCK signal 600 and a PDATA stream 610 which are transmitted on the clock signal line 200-2 and the bidirectional serial data line 202-1, respectively, of the digital bus 202. As shown in FIG. 6, the PDATA stream 610 comprises a plurality of data blocks 612; 614, 616, 618, and 620, and a direction control character 630 (DCC). The arrows in FIG. 6 denote a transmission direction of the data blocks 612, 614, 616, 618, and 620 and the direction control character 630. The data blocks 612, 614, 618 and 620 and direction control character 630 are shown as being transmitted in an outbound direction from a controller to a preamplifier (e.g., from the synchronous serial port control circuitry 112 to the preamplifier circuitry 130, FIG. 2). On the other hand, the data block 616 is shown as being transmitted in an inbound direction from the preamplifier to the controller (e.g. from the preamplifier circuitry 130 to the synchronous serial port control circuitry 112).

It is to be noted that the data blocks 612, 614, 618, and 620 transmitted from the controller to the preamplifier include actual blocks of data (e.g., register data, register address information, etc.) and/or control signals. For example, as noted above with reference to FIG. 2, in an outbound direction, one or more of the data blocks 612, 614, 618, and 620 can include register data (preamplifier configuration data and an associated register address) that is received by the port logic circuitry 216 (master) and transmitted to the preamplifier circuitry 130 for storage in one or more register banks of the register bank and command logic circuitry 246. Moreover, one or more of the data blocks 612, 614, 618 and 620 can include control signals such as write/read mode signals, and fly height heater control signals, register read control signals, etc., which are used to control certain functions of the preamplifier circuitry 130. In the inbound direction from the preamplifier to the controller, the data block 616 can include information such as configuration data, fault polling, head/disc spacing information measured by the fly height control circuitry 232, or other status information that is stored in register banks of the preamplifier circuitry, and accessed by the controller and recording channel. In one embodiment, the outbound direction is afforded a higher priority than the inbound direction because mode control and register loading functions are more time-critical than register read and polling operations, for example.

When certain information (register data, etc.) from the preamplifier circuitry 130 is desired, the port logic circuitry 216 (master) inserts the direction control character 630 into the PDATA stream to signal a direction switch for the port logic circuitry 226 (slave) to transmit digital signals on the bidirectional serial data line 202-1 to the synchronous serial port control circuitry 112. In one embodiment of the invention, the direction control character 630 comprises an initiate register read command together with register address data that specifies an address of the register from which data (or a pointer to another register) is to be read. In such embodiment, a direction switch is implied by the direction control character 630 that initiates a register read, and causes the preamplifier circuitry 130 to initiate control of the bidirectional serial line 202-1 to return the register read results. In another embodiment, the direction control character 630 can include a register address and byte count information for sequentially accessing register data from a series of registers. For instance, assume that each register stores a byte of data. If the control character 630 specifies a register address of 5 and byte count of 3, this command directs the preamplifier circuitry 130 to access the contents of a register with address 5, and the contents of the next three sequential registers 6, 7 and 8.

In another embodiment of the invention, the direction control character 630 may be a stand-alone direction control character that implies a direction switch for a register read command, wherein the register address (and possible byte count information) are transmitted on the bidirectional serial data line 202-1 just prior to the direction control character 630 or just after the direction control character 630. For example, in FIG. 6, the data block 614 just prior to the direction control character 630 can specify a register address that is to be read in response to the register read operation that is initiated by the direction control character 630. Moreover, the data block 612 can specify a register address and the data block 614 could specify a byte count. In such instance, the preamplifier circuitry 130 would know that the last received register address information block corresponds to the read command to be initiated in response to the direction control character 630. In another embodiment, the register address information and associated byte count can serially transmitted in data blocks following the stand-alone direction control character.

After the direction control character 630 (and an associated register address and possible byte count information) is transmitted, the port logic circuitry 216 (master) relinquishes control of the bidirectional serial data line 202-1 by asserting a logic "1" direction control signal (+D/−D) to the multiplexing circuitry 208, which disables the multiplexer switch 208-1 and enables the multiplexer switch 208-2. During a period of time 640 following transmission of the direction control character 630 (and associated register address data and possible byte count), the port logic circuitry 226 (slave) asserts control of the bidirectional serial data line 202-1 by asserting a logic "1" direction control signal (+D/−D) to the multiplexing circuitry 210, which enables the multiplexer switch 210-1 and disables the multiplexer switch 210-2, and thereupon transmits data accessed from the addressed register.

In addition, during the period of time 640 following transmission of the direction control character 630, the preamplifier circuitry 130 performs some sequencing operations (under control of the port logic circuitry 226 (slave) and the PCLOCK signal 600) to obtain the requested information for transmission back to the port logic circuitry 216 (master) over the bidirectional serial data line 202-1. Once the requested information is obtained, the port logic circuitry 226 (slave) serially transmits one or more data blocks (e.g., data block 616) to the port logic circuitry 216 (master) over the bidirectional serial data line 202-1.

During a period of time 650 following transmission of the data block 616, the port logic circuitry 226 (slave) relinquishes control of the bidirectional serial data line 202-1 by asserting a logic "0" direction control signal (+D/−D) to the multiplexing circuitry 210, which disables the multiplexer switch 210-1 and enables the multiplexer switch 210-2. Furthermore, during the period of time 650, the port logic circuitry 216 (master) asserts control of the bidirectional serial data line 202-1 by asserting a logic "0" direction control signal (+D/−D) to the multiplexing circuitry 208, which enables the multiplexer switch 208-1 and disables the multiplexer switch 208-2. Because of the synchronous control by PCLOCK 600, and because the port logic circuitry 216 (master) knows a priori how may bits of information will be transmitted in response to a request for information, the port logic circuitry 216 (master) knows when the transmission of the data block 616 over the bidirectional serial data line 202-1 is complete. For example, if a register read request is sent to the preamplifier circuitry 130 to read the contents of 5 registers in a register bank, and each register is one byte in length, then upon transmission of the register read results from the preamplifier circuitry 130 to the synchronous serial port control circuitry 112, the port logic circuitry 216 (master) would except to receive a serial data block 5 bytes in length.

The direction control character 630 can be generated using different techniques. For example, in one embodiment of the invention, the direction control character 630 comprises a 8 b/10 b code. As noted above, 8 b/10 b encoding is a protocol in which each eight-bit data byte is converted to a 10-bit transmission character. The encoding process provides 256 data characters, as well as 12 unique non-data control characters. In accordance with embodiments of the invention, the 8 b/10 b characters are used for identifying management functions or control. In accordance with an embodiment of the invention where outbound data transmitted over the bidirectional serial data line 202-1 is encoded using an 8 b/10 b code, the direction control character 630 may be chosen from surplus characters that are not used to encode data bytes. Since PDATA is DC coupled and not self-clocked, and transmission distances short, where spectral and maximum-run-length characteristics are not an issue, it is possible to simplify the code book for the 8 b/10 b encoding process.

In another embodiment of the invention, a direction control signal is inserted in the PCLOCK signal as a way to specify a direction switch to the preamplifier circuitry 130. For example, FIG. 7 is a timing diagram that illustrates a method to control a direction switch on a bidirectional serial data line by inserting a gap in PCLOCK signal stream according to an embodiment of the invention. In the context of the embodiment of FIG. 2, for example, FIG. 7 illustrates an example PCLOCK signal 700 and a PDATA stream 710 which are transmitted on the clock signal line 202-2 and the bidirectional serial data line 202-1, respectively, of the digital bus 202. As shown in FIG. 7, the PCLOCK signal 700 comprises a gap 702 that represents a predefined number of deleted clock cycles. The PDATA stream 710 comprises a plurality of data blocks 712, 714, 716, 718, and 720, and a control character 730. The arrows in FIG. 7 denote a transmission direction of the data blocks 712, 714, 716, 718, and 720 and the control character 730 between the controller and preamplifier (e.g., between the synchronous serial port control circuitry 112 and the preamplifier circuitry 130 of FIG. 2).

In the context of the embodiment of FIG. 2, the gap 702 is generated in the PCLOCK signal 700 by the clock generator 218 under command by the port logic circuitry 216 (master) and transmitted over the clock signal line 202-2 of the digital bus 202. In one embodiment, the clock generator 218 generates the gap 702 by deleting or otherwise suppressing a predetermined number of clock cycles of the PCLOCK signal 700, which is sufficient to allow reliable detection by the gap detector circuit 228 in the presence of timer tolerances. In the preamplifier circuitry 130, the gap 702 is detected by the gap detector circuit 228, wherein the gap detector circuit 228 outputs a gap detection signal to the port logic circuitry 226 (slave) upon detection of the gap 702.

In one embodiment of the invention, the gap detector circuit 228 is an asynchronous timer that operates to detect the gap 702 based on a predetermined amount of time that no clock pulses are detected for the PCLOCK signal 700, wherein the timer resets upon each positive edge of a received clock pulse, for example. The gap detector circuitry 228 can be implemented using other circuits that are suitable for the given gap detection application.

When the gap 702 is generated to trigger a direction switch of the serial port, the port logic circuitry 216 (master) stops transmitting information signals on the bidirectional serial data line 202-1. In particular, as shown in FIG. 7, during the period in which the gap 702 is generated in the PCLOCK signal 700, there is a corresponding period of time 740 in which no information is transmitted via the PDATA stream 710 to the preamplifier circuitry 130. After the gap 702 is generated, the PCLOCK signal 700 is commenced, and the port logic circuitry 216 (master) transmits the control character 730 (e.g., register read command, etc.) to the preamplifier circuitry 130. The detection of the gap 702 by the gap detector circuit 228 in the preamplifier circuitry 130 causes the initiation of the operation specified by the control character 730 upon the occurrence of the next rising edge of the PCLOCK signal 700 following the gap 702. The control character 730 specifies the register address to be read, and possible a byte count. The occurrence of the gap 702 implies that the next character received by the preamplifier circuitry 130 is the control character 730.

During a period of time 750 following transmission of the control character 730, the port logic circuitry 216 (master) relinquishes control of the bidirectional serial data line 202-1 by asserting a logic "1" direction control signal (+D/−D) to the multiplexing circuitry 208, which disables the multiplexer switch 208-1 and enables the multiplexer switch 208-2. In addition, during the period of time 750 following transmission of the control character 730, the port logic circuitry 226 (slave) asserts control of the bidirectional serial data line 202-1 by asserting a logic "1" direction control signal (+D/−D) to the multiplexing circuitry 210, which enables the multiplexer switch 210-1 and disables the multiplexer switch 210-2.

Furthermore, during the period of time 750 following transmission of the control character 730, the preamplifier circuitry 130 performs some sequencing operations (under control of the port logic circuitry 226 (slave) and the PCLOCK signal 700) to obtain the requested information for transmission back to the port logic circuitry 216 (master) over the bidirectional serial data line 202-1. Once the requested information is obtained, the port logic circuitry 226 (slave) serially transmits one or more data blocks (e.g., data block 716) to the port logic circuitry 216 (master) over the bidirectional serial data line 202-1.

During a period of time 760 following transmission of the data block 716 from the preamplifier circuitry 130 to the synchronous serial port control circuitry 112, the port logic circuitry 226 (slave) relinquishes control of the bidirectional serial data line 202-1 by asserting a logic "0" direction control signal (+D/−D) to the multiplexing circuitry 210, which disables the multiplexer switch 210-1 and enables the multiplexer switch 210-2. Furthermore, during that period of time 760, the port logic circuitry 216 (master) asserts control of the bidirectional serial data line 202-1 by asserting a logic "0" direction control signal (+D/−D) to the multiplexing circuitry 208, which enables the multiplexer switch 208-1 and disables the multiplexer switch 208-2. Because of the synchronous control by PCLOCK 700, and because the port logic circuitry 216 (master) knows a priori how may bits of information will be transmitted in response to a request for information, the port logic circuitry 216 (master) knows when the transmission of the data block 716 over the bidirectional serial data line 202-1 is complete.

In the embodiment of FIG. 7, 8 b/10 b-like coding is unnecessary, as the gap 702 in the PCLOCK signal 700 serves as a direction-change demarker. An advantage to using the gap detection process of FIG. 7 is that it supports forced abort of transfer operations in progress, reducing latency of mode changes, and provides an unambiguous periodic initialization of serialization/deserialization counters in the preamplifier circuitry 130. When using a gap detection process, the PCLOCK signal 700 continuously runs, except when a gap is generated.

In other embodiments of the invention, circuits and methods as disclosed in U.S. patent application Ser. No. 13/650,474, filed on Oct. 12, 2012, entitled Preamplifier-To-Channel Communication in a Storage Device, and U.S. patent application Ser. No. 13/719,615, filed on Dec. 19, 2012, entitled Tag Multiplication Via A Preamplifier Interface, can be implemented in the port logic circuitry 216 (master) and/or port logic circuitry 226 (slave) for generating and merging bit significant signals within a synchronous serial port framework supported by the digital bus 202 as discussed above with reference to FIGS. 2 and 3. These applications are commonly assigned and fully incorporated herein by reference. In general, U.S. patent application Ser. No. 13/650,474 discloses methods for merging bit significant signals onto a unified high-speed serial port. Moreover, U.S. patent application Ser. No. 13/719,615 discloses methods for generating additional bit significant signals within the preamplifier circuitry without the need for additional signaling wires.

In one embodiment of the invention, to minimize transaction time and latency over the synchronous serial communication port, the PCLOCK signal operates at a high frequency, e.g., 1-2 GHz (i.e., 1-2 Gbit/sec transfer rate). In one embodiment, the synchronous serial data port and associated sequencing functions operate on a rising clock edge of PCLOCK, although in other embodiments, the synchronous serial data port and associated sequencing functions can operate on both the rising and falling clock edges of PCLOCK. When operating a synchronous serial communication port with high-speed clocking (e.g., 1-2 GHz), it is desirable to maintain reliable communication over the serial port despite possible time skewing between the PDATA bit stream and the PCLOCK signal. Indeed, when a serial data stream (PDATA) is captured in a receiving flip-flop circuit that is clocked by the associated synchronous clock signal (PCLOCK), the existence of time skew between the PCLOCK and PDATA signal streams can adversely affect the ability of the receiving flip-flop to receive every transmitted data bit, which can thereby degrade the reliability of data transfer at high-speed clock rates. Accordingly, in one embodiment of the invention, the synchronous serial port control circuitry 112 and preamplifier circuitry 130 operate in collaboration to measure skew between the PCLOCK and PDATA streams and align the streams based on the measured skew.

Figure 8:
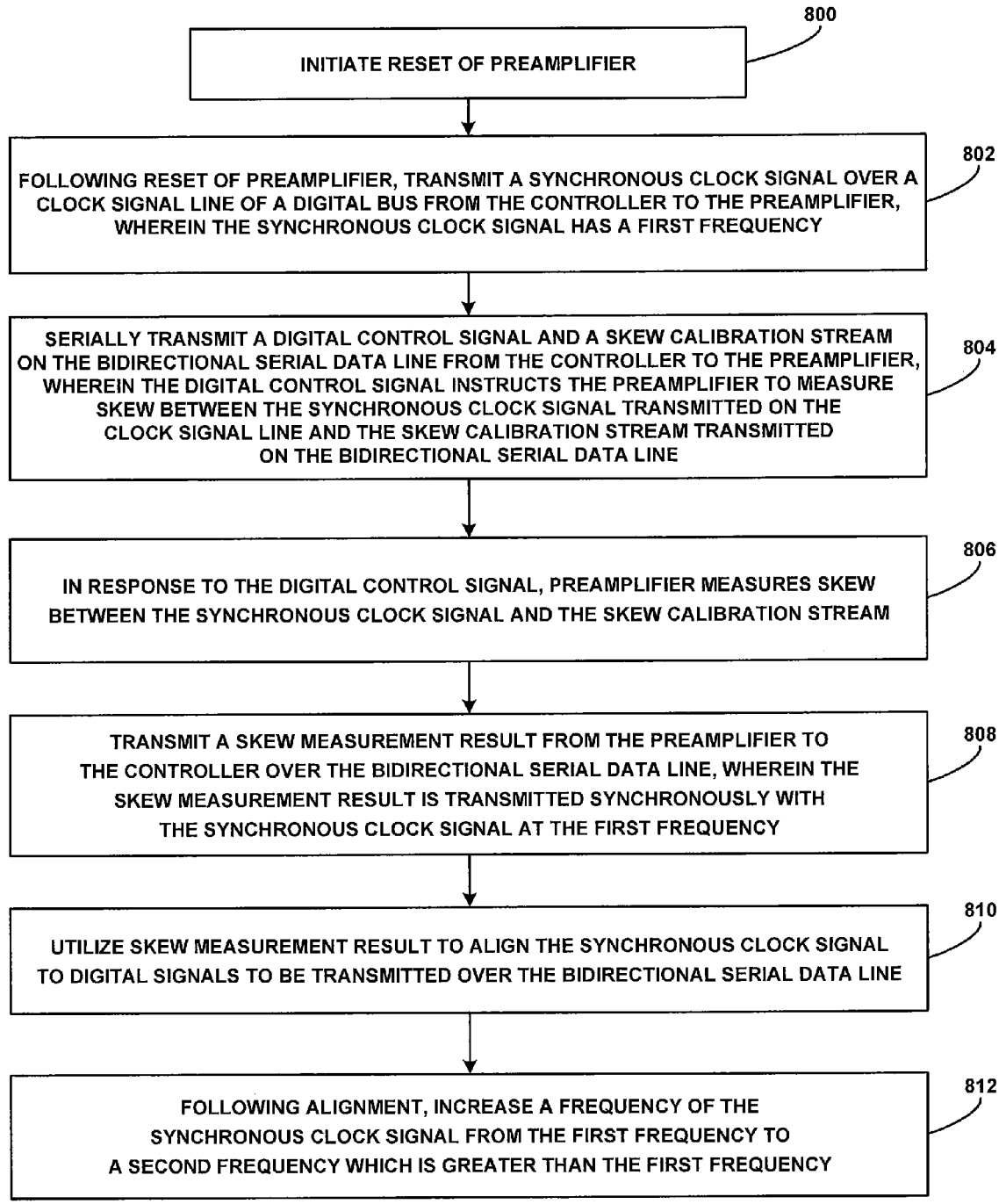
FIG. 8 is a flow diagram of method to align a synchronous clock signal with digital signals to be transmitted over a bidirectional serial data line using a skew measurement protocol, according to an embodiment of the invention.

For example, FIG. 8 is a flow diagram of skew measurement method that is implemented by a serial port controller and preamplifier to align a synchronous clock signal with digital signals to be transmitted over a bidirectional serial data line using a skew measurement protocol, according to an embodiment of the invention. For purposes of illustration, the method of FIG. 8 will be discussed with reference to the storage device embodiments depicted in FIGS. 2 and 3, wherein the method is implemented to provide reliable communication between the synchronous serial port control circuitry 112 and the preamplifier circuitry 130 in the presence of skew between a PDATA stream and an associated PCLOCK signal.

Referring to FIG. 8, an initial step is to initiate reset of the preamplifier circuitry 130 (block 800). Various methods for resetting/initializing the preamplifier circuitry 130 will be discussed in further detail below with reference to FIGS. 10 and 11, for example. Following reset of the preamplifier circuitry 130, a synchronous clock signal (PCLOCK) is transmitted over the clock signal line 202-1 of the digital bus 202 from the synchronous serial port control circuitry 112 to the preamplifier circuitry 130, wherein the synchronous clock signal (PCLOCK) is initially transmitted at a first frequency which is less than a normal operating frequency of the synchronous serial data port (block 802). As explained above, the synchronous clock signal (PCLOCK) synchronizes the transfer and processing of digital signals (PDATA) transmitted on the bidirectional serial data line 202-1 of the digital bus 202.

Next, a digital control signal (Measure_Skew control character) and a skew calibration stream (e.g., skew calibration clock signal) are serially transmitted on the bidirectional serial data line 202-1 from the synchronous serial port control circuitry 112 to the preamplifier circuitry 130 (block 804), The digital control signal (Measure_Skew control character) is a control character that instructs the preamplifier circuitry 130 to measure skew between the synchronous clock signal (PCLOCK) transmitted on the clock signal line 202-2 and the skew calibration stream transmitted on the bidirectional serial data line 202-1. In response to the digital control signal, the preamplifier circuitry 130 measures the skew between the synchronous clock signal and the skew calibration stream (block 806). In another embodiment of the invention, a measure skew operation can be commanded by writing to an appropriate control register.

A skew measurement result is then transmitted from the preamplifier circuitry 130 to the synchronous serial port control circuitry 112 over the bidirectional serial data line 202-1, wherein the skew measurement result is transmitted synchronously with the synchronous clock signal (PCLOCK) operating at the first frequency (block 808). The synchronous serial port control circuitry 112 uses the skew measurement result to align the synchronous clock signal (PCLOCK) to digital signals (PDATA) to be transmitted over the bidirectional serial data line 202-1 (block 810). For example, in one embodiment of the invention, the port logic circuitry 216 uses the skew measurement result to access a corresponding delay value that is stored in a local register, and use that delay value to programmatically adjust the alignment circuitry 220 to adjust a delay value of a delay line, for example, and adjust a phase of the PCLOCK signal. In particular, the alignment circuitry 220 will apply a delay to the clock signal PCLOCK output from the clock generator 218 so as to phase align clock pulses of the synchronous clock signal (PCLOCK) to serially transmitted data bits of the digital data stream (PDATA) transmitted over the bidirectional serial data line 202-1. Following alignment, a frequency of the synchronous clock signal (PCLOCK) is increased from the first frequency to a second frequency, which is greater than the first frequency (block 812). In one embodiment of the invention, the second frequency is the normal operating frequency of the synchronous serial data port (e.g., 1-2 GHz). In the skew measurement process of FIG. 8, after reset of the preamplifier circuitry 130, the PCLOCK signal stream and PDATA data stream are temporarily operated at a lower frequency (e.g., 100 MHZ) than the normal operation frequency (e.g., 1-2 GHz) of the synchronous serial data port. This enables the measure skew control character, which is transmitted over the bidirectional serial data line 202-1 to initiate the skew measurement process, to be reliably detected by the preamplifier circuitry 130 despite any minimal time skew. Indeed, such minimal time skew would not degrade the ability to properly detect the serially transmitted data bits of the skew measure control character that are synchronously transmitted at the lower PCLOCK frequency. Moreover, while the actual skew measurement between the skew calibration stream and PCLOCK signal stream can be implemented at the slower frequency or the higher operating frequency of the serial data port, it is preferable that the skew result is transmitted back to the synchronous serial port control circuitry 112 with the PCLOCK operating at the lower frequency. This enables the skew result to be reliably detected by the synchronous serial port control circuitry 112 despite any minimal time skew, because such time skew would not degrade the ability to detect the serially transmitted data bits of the skew result, which are synchronously transmitted at the lower PCLOCK frequency.

Figure 9:
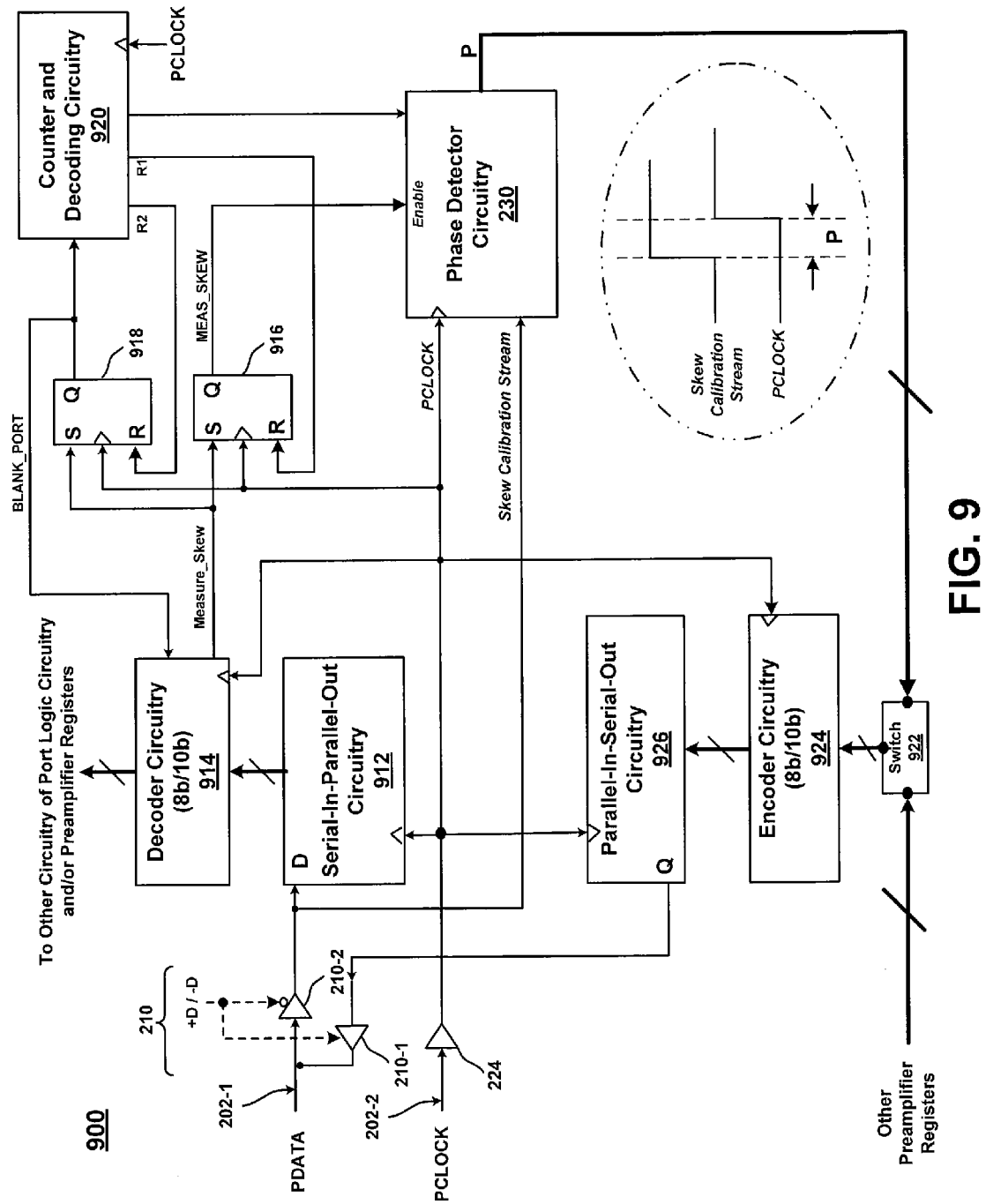
FIG. 9 is a block diagram of skew measurement circuitry according to an embodiment of the invention.
Figure 10:
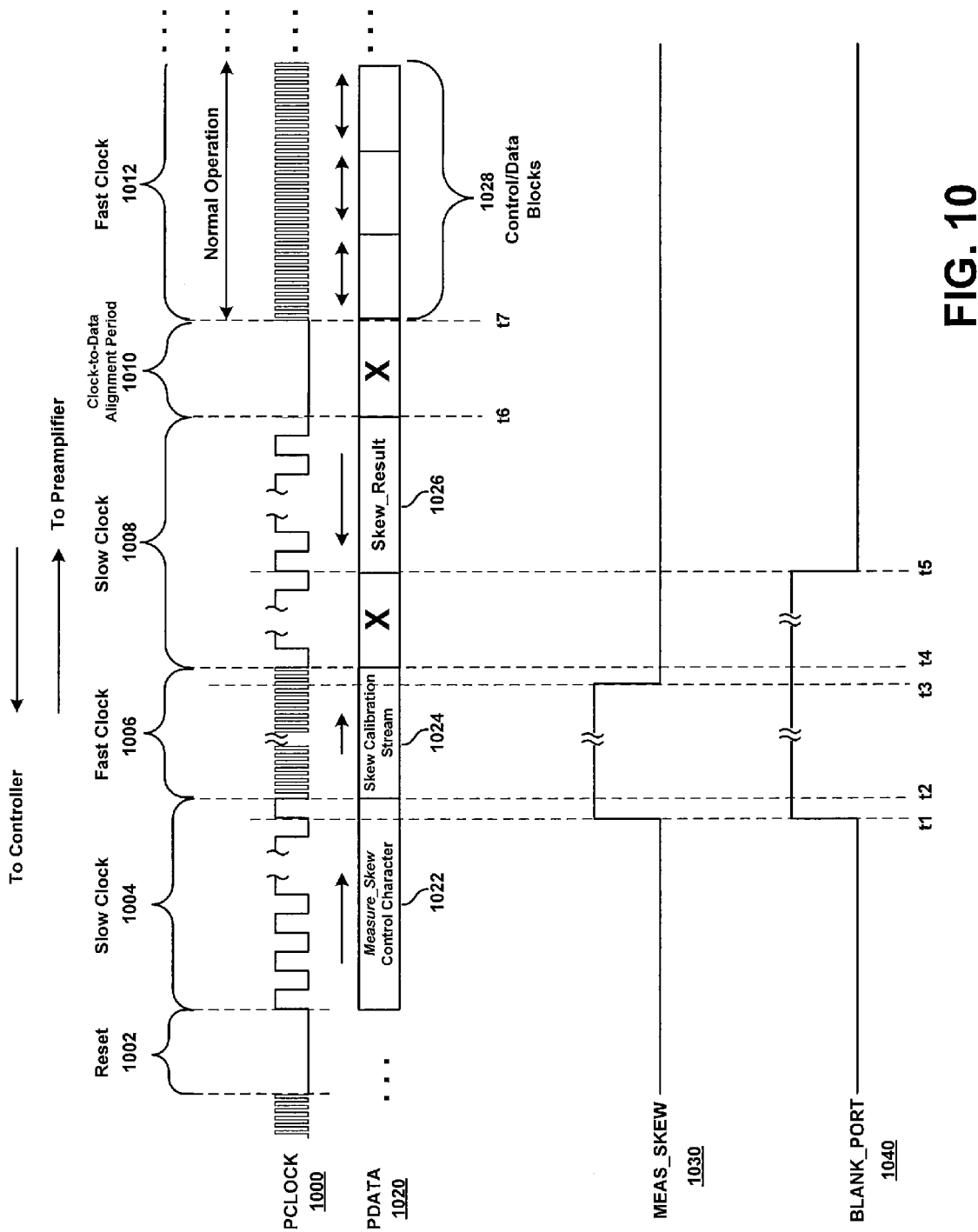
FIG. 10 is a timing diagram that illustrates a method of operation of the skew measurement circuitry of FIG. 9, according to an embodiment of the invention.

FIG. 9 is a block diagram of skew measurement circuitry according to an embodiment of the invention. In particular, FIG. 9 illustrates skew measurement circuitry 900 that is implemented in the preamplifier circuitry 130 to perform a skew measurement process as described above with reference to FIG. 8, according to an embodiment of the invention. Moreover, FIG. 10 is a timing diagram that illustrates a method of operation of the skew measurement circuitry 900 of FIG. 9 to generate a skew measurement result which is used to align a synchronous clock signal with digital signals to be transmitted over a bidirectional serial data line, according to an embodiment of the invention.

As shown in FIG. 9, the skew measurement circuitry 900 comprises serial-in-parallel-out (SIPO) circuitry 912, decoder circuitry 914, a first SR flip-flop 916, a second SR flip-flop 918, counter and decoding circuitry 920, switching circuitry 922, encoder circuitry 924, and parallel-in-serial-out (PISO) circuitry 926. The skew measurement circuitry 900 also includes the phase detector circuitry 230 shown in FIGS. 2 and 3. As depicted in FIG. 9, the sequencing operations of the various circuit components 912, 914, 916, 918, 920, 924, 926, and 230 of the skew measurement circuitry 900 are synchronously controlled by a rising edge of the synchronous clock signal PCLOCK which is input to the clock port of each of said components.

In one embodiment of the invention, the various circuit components 912, 914, 916, 918, 920, 922, 924, and 926 of the skew measurement circuitry 900 are components of the port logic circuitry 226 (slave) shown in FIGS. 2 and 3, which are used in conjunction with the phase detector circuitry 230 to implement the skew measurement circuitry 900. In particular, the SIPO circuitry 912, decoder circuitry 914, counter and decoding circuitry 920, encoder circuitry 924, and the PISO circuitry 926 are circuit components that are employed by the port logic circuitry 226 (slave) during normal transactions of the synchronous serial port. The first and second SR flip-flop circuits 916 and 918 and the phase detector circuitry 230 are utilized in conjunction with the circuit components 912, 914, 920, 924, and 926, for example, to perform a skew measurement process.

In general, the SIPO circuitry 912 receives a serial data stream (PDATA) that is transmitted from the synchronous serial port control circuitry 112 over the bidirectional serial data line 202-1 and converts the serial data into parallel data blocks (e.g., bytes) using known techniques. The parallel data blocks (output from the SIPO circuitry 912) are input to the decoder circuitry 914, wherein the decoder circuitry 914 decodes the data blocks to recover data and control characters that are transmitted to the preamplifier circuitry 130. For example, the data may be register data that is to be stored in associated register banks of the preamplifier circuitry 130, where the register data is used to execute or otherwise support various functions of the preamplifier circuitry 130. Moreover, the control characters may include predetermined characters that instruct the preamplifier circuitry 130 to perform various functions.

For example, in the context of skew measurement, the decoder circuitry 914 will identify a predefined control character (Measure_Skew control character) that is transmitted to the preamplifier circuitry 130 to commence a skew measurement process as described above with reference to FIG. 8. In one embodiment of the invention, where serial data is transmitted over the bidirectional serial data line 202-1 using 8 b/10 b encoding, the decoder circuitry 914 implements methods for decoding the 8 b/10 b data blocks, and the encoder circuitry 924 implements methods for generating 8 b/10 b encoded data blocks for transmission over the bidirectional serial data line 202-1 to the synchronous serial port control circuitry 112.

When the decoder circuitry 914 detects a predefined 8 b/10 b control character that is assigned to initiate a skew measurement process, the decoder circuitry 914 will output a control signal, Measure_Skew, to a set port (S) of the first and second SR flip-flop circuits 916 and 918, which serves to "set" the first and second SR flip-flop circuits 916 and 918. More specifically, in one embodiment, in response to detecting a skew measure control character, the decoder circuitry 914 will output a pulse to "set" the first and second SR flip-flop circuits 916 and 918, resulting in a logic "1" level maintained at the output ports (Q) of the first and second SR flip flop circuits 916 and 918.

As shown in FIG. 9, the Q output of the first SR flip-flop circuit 916 is connected to an Enable input port of the phase detector circuitry 230. Further, the Q output of the second SR flip-flop circuit 918 is connected to a control input of the counter and decoding circuitry 920 and to a control input of the decoder circuitry 914. A "set" logic level (MEAS_SKEW set to logic "1") at the Q output of the first SR flip-flop circuit 916 serves to enable the phase detector circuitry 230 to begin a process for determining a phase difference (P) between the PCLOCK clock signal and a skew calibration stream transmitted on the bidirectional serial data line 202-1. In addition, a "set" logic level (BLANK_PORT set to logic "1") at the Q output of the second SR flip-flop circuit 918 causes the counter and decoding circuitry 920 to commence a counting process. This counting process counts a number of clock cycles of the synchronous clock signal PCLOCK, which are input to the clock port of the counter and decoding circuitry 920 after the second SR flip-flop circuit 918 is set in response to the Measure_Skew control signal. Furthermore, a "set" logic level at the Q output of the second SR flip-flop circuit 918 causes the decoder circuitry 914 to temporarily suspend a decoding process, as there is no need to decode any PDATA transmitted on the bidirectional serial data line 202-1 during a skew measurement process.

The phase detector circuitry 230 can be implemented using known circuit architectures and phase detection techniques. In general, the phase detector circuitry 230 is configured to compare arriving edges of the PCLOCK signal and a skew calibration stream (e.g., calibration clock signal) transmitted on the bidirectional serial data line 202-1 to determine a phase difference between the PCLOCK signal and skew calibration stream. For example, in one embodiment, the phase detector circuitry 230 can be implemented using a well-known architecture which comprises a digital phase detector and charge-pump, followed by an analog to digital converter. In another embodiment, the phase detector circuitry 230 can be configured to make a direct digital measurement using an inverter chain to freeze relative positions of the PCLOCK and skew calibration signals. In yet another embodiment, phase detection can be implemented using an approach that relies on BER (bit error rate) detection against a pseudo-random binary sequence (PRBS) locally generated in the preamplifier circuitry 130. Phase detection circuits and methods are well known in the art and, consequently, a detailed explanation is not needed for one of ordinary skill in the art to understand embodiments of the invention as discussed herein.

The counter and decoding circuitry 920 generates a first control pulse R1 to "reset" the first SR flip-flop circuit 916. In particular, after counting a first predetermined number of rising edges of the PCLOCK signal (i.e., count value meets a first predetermined value), the counter and decoding circuitry 920 generates and outputs the first control pulse R1, which is input to a reset port (R) of the first SR flip-flop circuit 916. The first control pulse R1 causes the Q output of the first SR flip-flop circuit 916 to transition to a logic "0" level. When the MEAS_SKEW control signal is at a logic "0" level, the phase detector circuitry 230 terminates the phase detection process. At this time, the phase detector circuitry 230 temporarily holds a determined phase difference value (denoted as "P") for a subsequent period of time that it takes for the preamplifier circuitry 130 to gain control of the bidirectional serial data line 202-1 for transmitting the phase difference value P as a "skew result" to the synchronous serial port control circuitry 112.

Moreover, the counter and decoding circuitry 920 generates a second control pulse R2 to "reset" the second SR flip-flop circuit 918. In particular, after counting a second predetermined number of rising edges of the PCLOCK signal (i.e., count value meets a second predetermined value after the first predetermined value), the counter and decoding circuitry 920 generates and outputs the second control pulse R2, which is input to a reset port (R) of the second SR flip-flop circuit 918. The second control pulse R2 causes the Q output of the second SR flip-flop circuit 918 to transition to a logic "0" level. When the BLANK_PORT control signal is at a logic "0" level, the counter and decoding circuitry 920 generates a control signal to the phase detector circuitry 230 to output the determined phase difference value P for encoding and transmission of the encoded P value as a "skew result" to the synchronous serial port control circuitry 112. In addition, when the BLANK_PORT control signal is at a logic "0" level, the decoder circuitry 914 is enabled for decoding subsequent blocks of serial data that may be received over the bidirectional serial data line 202-1 following the skew measurement process.

The phase difference value P comprises a plurality of data bits (e.g., byte) that are output in parallel from the phase detector circuitry 230 and input to the encoder circuitry 924 through the switch 922. In one embodiment, the encoder circuitry 924 8 b/10 b encodes the phase difference value Pinto a "skew result" character. The skew result character is input to the PISO circuitry 926, wherein the data bits of the skew result character are serialized and transmitted over the bidirectional serial data line 202-1 to the synchronous serial port control circuitry 112. When a skew measurement process is not being performed, the switch 922 is configured to pass other preamplifier register data (which is access from the register bank and command logic circuitry 246, FIGS. 2, 3) for encoding, serialization, and transmission over the bidirectional serial data line 202-1 of the digital bus 202 to the synchronous serial port control circuitry 112.

In an alternate embodiment of the invention, except for the phase detector circuitry 230, the functions of the various circuit components shown in FIG. 9 can also be performed under control of firmware executed in the hard disk controller 102 (FIG. 1) using the synchronous serial port in a manner as discussed herein, but operating at a throttled-down clock rate. In such embodiment, a writeable register bit would be used to perform the operation of the first SR flip-flop circuit 916 as discussed above. Upon conclusion of a skew measurement, the port logic circuitry 216 (master) would read the skew result from a holding register in one of the register banks 246 in the preamplifier circuitry 130.

FIG. 10 is a timing diagram that illustrates a method of operation of the skew measurement circuitry of FIG. 9, according to an embodiment of the invention. In particular, FIG. 10 schematically illustrates a method of operation of the skew measurement circuitry of FIG. 9 in conjunction with the method discussed above with reference to FIG. 8. In the context of the embodiment of FIG. 9, for example, FIG. 10 illustrates an example PCLOCK signal 1000 and PDATA stream 1020 which are transmitted on the clock signal line 202-2 and the bidirectional serial data line 202-1, respectively, to implement a skew measurement process according to an embodiment of the invention. Moreover, FIG. 10 depicts an example MEAS_SKEW control signal 1030 and BLANK_PORT control signal 1040, which are output from the Q outputs of the first and second SR flip-flop circuits 916 and 918 (FIG. 9) during a skew measurement process.

FIG. 10 depicts the PCLOCK signal 1000 at different periods of time before, during, and after, a skew measurement process. In particular, the different time periods of the PCLOCK signal 1000 as shown include a reset period 1002, a slow clock period 1004, a fast clock period 1006, a slow clock period 1008, a clock-to-data alignment period 1010, and a fast clock period 1012 (or normal operating period). As further depicted in FIG. 10, the PDATA stream 1020 comprises a plurality of data streams 1022, 1024, 1026, and 1028, wherein the arrows in FIG. 10 denote a transmission direction of the data streams 1022, 1024, 1026, and 1028 between the synchronous serial port control circuitry 112 and the preamplifier circuitry 130.

As discussed above with reference to FIG. 8, to commence a skew measurement process, the preamplifier circuitry 130 is reset during the reset period 1002. In one embodiment of the invention, as shown in FIG. 10, a reset of the preamplifier circuitry 130 is initiated by creating a gap in the synchronous clock signal PCLOCK 1000, wherein no clock pulses are transmitted on the clock signal line 202-2 for a predetermined period of time. The gap in the synchronous clock signal PCLOCK 1000 is detected by the gap detector circuit 228 (FIGS. 2 and 3) to signal a reset of the preamplifier circuitry 130. In another embodiment of the invention, as discussed in further detail below with reference to FIG. 11, initiating a reset of the preamplifier circuitry 130 is performed by temporarily increasing a common-mode voltage on the bidirectional serial data line 202-1 or the clock signal line 202-2 of the digital bus 202. A preamplifier reset is initiated each time a skew measurement process is to be performed. In one embodiment of the invention, a skew measurement process is automatically performed after a power-up of the preamplifier circuitry 130. Moreover, a skew measurement process can be periodically performed during run-time to re-measure skew and periodically adjust the PCLOCK/PDATA alignment to account for changes in skew that may occur over run-time dues to changes in operating conditions, e.g., changes in temperature, etc.

During the slow clock period 1004 following the reset period 1002, the PCLOCK signal 1000 is transmitted over the clock signal line 202-1 at a frequency (e.g., 100 MHz) which is less than a normal operating frequency (e.g., 1-2 GHz) of the synchronous serial data port. Moreover, during the slow clock period 1004, the port logic circuitry 216 (master) sends a Measure_Skew control character 1022 (e.g., 8 b/10 b code) in the outbound PDATA stream to instruct the preamplifier circuitry 130 to commence a skew measurement process to measure skew between the PCLOCK and PDATA streams. In this embodiment, the Measure_Skew control character 1022 is transmitted synchronously with the lower frequency PCLOCK signal 1000 during the slow clock period 1004. This allows the SIPO circuitry 912 and decoder circuitry 914 (FIG. 9) to reliability detect the serially transmitted data bits of the Measure_Skew control character 1022 despite any minimal time skew, because such time skew would not degrade the ability to properly detect the serially transmitted data bits of the Measure_Skew control character that are synchronously transmitted at the lower PCLOCK frequency.

At time t1 during the slow clock period, it is assumed that the Measure_Skew control character has been detected by the decoder circuitry 914, and that the decoder circuitry 914 has issued a Measure_Skew control pulse to the set port (S) of the first and second SR flip-flops 916 and 918, causing the Q outputs of the first and second SR flip-flops 916 and 918 to transition to a logic "1" level. Indeed, as depicted in FIG. 10, at time t1, the MEAS_SKEW signal 1030 (at the Q output of first SR flip-flop circuit 916) and the BLANK_PORT signal 1040 (at the Q output of the second SR flip-flop circuit 918) are depicted as transitioning to logic "1." At time t1, the preamplifier circuitry 130 switches to a skew measure mode.

At time t2, the fast clock period 1006 begins, wherein the PCLOCK signal 1000 is transmitted over the clock signal line 202-2 at a frequency that is greater than the frequency of the PCLOCK signal 1000 transmitted during the previous slow clock period 1004. For example, in one embodiment of the invention, during the fast clock period 1006, the frequency of the PCLOCK signal 1000 is increased to a normal operating frequency of the synchronous serial data port (e.g., 1-2 GHz). Furthermore, at time t2, a change in the state of the PDATA stream occurs, wherein the skew calibration stream 1024 begins to be transmitted on the bidirectional serial data line 202-1. In one embodiment of the invention, the skew calibration stream 1024 is a clock signal that is transmitted at the same frequency as the PCLOCK signal 1000 is transmitted during the fast clock period 1006.

In the example embodiment of FIG. 10, it is assumed that PDATA changes state on a falling clock edge of the PCLOCK signal 1000, and that the rising edges of the PCLOCK signal 1000 are used to control the timing of sequencing operations performed by the control logic that executes the skew measurement process. As such, as depicted in FIG. 10, the MEAS_SKEW control signal 1030 and the BLANK_PORT control signal 1040 are asserted at the time t1 of a rising edge of the last clock pulse of the PCLOCK signal 1000 in the slow clock period 1004. Moreover, as shown in FIG. 10, PDATA changes state by transmitting the skew calibration stream 1024 at time t2 of a falling edge of the last clock pulse of the PCLOCK signal 1000 in the slow clock period 1004.

During the fast clock period 1006, as noted above with reference to FIG. 9, the MEAS_SKEW control signal 1030 is input to the Enable port of the phase detector circuitry 230 to commence a skew measurement process wherein the phase detector circuitry 230 is configured to measure the relative timing between the PCLOCK signal and the skew calibration stream 1024 transmitted on the bidirectional serial data line 202-1. In a conventional phase detector circuit, a voltage signal is generated (via a charge pump) which represents a phase different the PCLOCK signal 1000 and the skew calibration steam 1024, which are input to the phase detector circuitry 230. The phase detector circuitry 230 operates for a predetermined number of clock cycles of the PCLOCK signal 1000, which is deemed, a priori, to be sufficient for the phase detector circuitry 230 to complete a sequence of operations to detect a phase difference between the PCLOCK signal 1000 and the skew calibration stream 1024.

Moreover, during the fast clock period 1006, assertion of the BLANK_PORT control signal 1040 serves to initiate a counting operation in the counter and decoding circuitry 920 to count a number of clock cycles of the PCLOCK signal 1000 that are used to perform the skew measurement process of the phase detector circuitry 230. In addition, the BLANK_ PORT control signal 1040 serves to temporarily disable the decoder circuitry 914 and essentially block communication (temporarily) between the synchronous serial data port and other preamplifier circuitry 130 which is not utilized for the skew measurement process.

Next, at time t3 as shown in FIG. 10, it is assumed that the counter and decoding circuitry 920 has counted a first predetermined number of rising edges of the PCLOCK signal 1000 (i.e., count value meets a first predetermined value) that was needed for the phase detector circuitry 230 to complete a sequence of operations to detect a phase difference between the PCLOCK signal 1000 and the skew calibration stream 1024. Accordingly, at time t3, the MEAS_SKEW control signal 1030 transitions to logic "0", which causes the phase detector circuitry 230 to terminate the phase detection process. As discussed above with reference to FIG. 9, the MEAS_SKEW control signal is set to logic "0" by the counter and decoding circuitry 920 outputting the first control pulse R1 to reset the first SR flip-flop circuit 916 and generate a logic "0" at the Q output of the first SR flip-flop circuit 916.

For the remainder of the fast clock period 1006 from time t3 to time t4, the phase detector circuitry 230 can operate to digitize the detected phase difference value (P) for output. For example, in a conventional phase detector circuit where a voltage is generated (via a charge pump) which represents a phase difference between the PCLOCK signal 1000 and the skew calibration stream 1024, the charge pump can be disabled at time t3, and the voltage that is maintained by the charge pump can be digitized via and analog-to-digital converter to generate the digital phase difference value (P).

At time t4, the slow clock period 1008 begins, wherein the PCLOCK signal 1000 is throttled down to a lower frequency (e.g., 100 MHz) which is the same or similar to the frequency of the PCLOCK signal 1000 in the previous slow clock period 1004. During a period of time from t4 to t5, to avoid contention on the synchronous serial port, no PDATA is transmitted on the bidirectional serial data line 202-1. Rather, during the period from t4 to t5, the port logic circuitry 216 (master) relinquishes control of the bidirectional serial data line 202-1, and port logic circuitry 226 (slave) asserts control of the bidirectional serial data line 202-1 by asserting the proper logic levels of the direction control signals (+D/−D) to the respective multiplexing circuitry 208/210, as discussed above. Furthermore, during the time period from t4 to t5, the skew measurement is "frozen" wherein the phase detector circuitry 230 maintains the skew measurement value (P) for output upon commend from the counter and decoding circuitry 920.

Next, at time t5 as shown in FIG. 10, it is assumed that the counter and decoding circuitry 920 has counted a second predetermined number of rising edges of the PCLOCK signal 1000 (i.e., count value meets the second predetermined value) needed to (i) digitize the skew measurement value and to (ii) switch control of the bidirectional serial data line 202-1 to the preamplifier circuitry 130 to transmit the skew result to the synchronous serial port control circuitry 112. Accordingly, at time t5, the BLANK_PORT control signal 1040 transitions to logic "0", which causes the counter and decoding circuitry 920 to terminate the counting process, and which enables the decoder circuitry 914. As discussed above with reference to FIG. 9, the BLANK_PORT control signal 1040 is set to logic "0" by the counter and decoding circuitry 920 outputting the second control pulse R2 to reset the second SR flip-flop circuit 918 and generate a logic "0" at the Q output of the second SR flip-flop circuit 918.

During the slow clock period 1008, when the BLANK_PORT control signal 1040 is de-asserted, the phase detector circuitry 230 outputs (upon command from the counter and decoding circuitry 920) a plurality of parallel bits representative of the digitized skew measurement value (P). The digital skew measurement value (P) is encoded and serialized by the encoder circuitry 924 and the PISO circuitry 926, respectively, to generate the skew result 1026 data stream that is serially transmitted to the synchronous serial port control circuitry 112 over the bidirectional serial data line 202-1. As shown in FIG. 10, the skew result 1026 is serially transmitted synchronously with a lower frequency PCLOCK signal 1000 during the slow clock period 1008. This enables the serially transmitted data bits of the skew result 1026 to be reliably detected by the synchronous serial port control circuitry 112 despite any minimal time skew, because such time skew would not degrade the ability to detect the serially transmitted data bits of the skew result 1026, which are synchronously transmitted at the lower PCLOCK frequency.

Next, during a period of time from t6 to t7 (i.e., the clock-to-data alignment period 1010) following the slow clock period 1008, the synchronous serial port control circuitry 112 uses the skew result 1026 to align the PCLOCK signal to digital signals (PDATA) to be transmitted over the bidirectional serial data line 202-1 using techniques as discussed herein (e.g., using the alignment circuitry 220). Moreover, as depicted in FIG. 10, during the clock-to-data alignment period 1010, no PCLOCK signal is transmitted on the clock signal line 202-2, and to avoid contention on the synchronous serial port, no PDATA is transmitted on the bidirectional serial data line 202-1. Rather, during such time period from t6 to t7, while an alignment process is being performed by the synchronous serial port control circuitry 112, the port logic circuitry 226 (slave) can relinquish control of the bidirectional serial data line 202-1, and the port logic circuitry 216 (master) can assert control of the bidirectional serial data line 202-1 by asserting the proper logic levels of the direction control signals (+D/−D) to the multiplexing circuitry 208/210, as discussed above.

Following the clock-to-data alignment period 1010, the frequency of the PCLOCK signal 1000 is increased to a normal operating frequency of the synchronous serial data port (e.g., 1-2 GHz). Accordingly, as shown in FIG. 10, during the fast clock period 1012 following the clock-to-data alignment period 1010, the synchronous serial data port is operated normally, wherein control/data blocks 1028 are transmitted between the synchronous serial port control circuitry 112 and the preamplifier circuitry 130 using techniques as described above with reference to FIGS. 5, 6 and 7, for example.

Since the recording channel circuitry 110 must read register data stored within the register banks 246 of the preamplifier circuitry 130, various skew measurement and/or adjustment techniques can be implemented in addition to, or in lieu of, the skew measurement protocol and circuitry discussed above with reference to FIGS. 8, 9 and 10. For example, depending on the frequency of operation, a self-clocking, 8 b/10 b line coding protocol can be used to encode inbound serial port data from the preamplifier circuitry 130 to the synchronous serial port control circuitry 112. This allows a full-speed inbound port operation while mitigating the effects of skew.

In another embodiment, the frequency of the synchronous clock signal PCLOCK can be throttled down during inbound PDATA transfers from the preamplifier circuitry 130 to the synchronous serial port control circuitry 112. This embodiment takes into consideration that the inbound PDATA transmissions are then not seriously affected by latency. This embodiment adds no complexity to the preamplifier circuitry 130.

As noted above, the ability to force an overriding reset of the preamplifier circuitry 130 is useful in various instances, such as when initiating a skew measurement process. As discussed above, a reset of the preamplifier circuitry 130 can be performed by inserting a "gap" within the synchronous clock signal PCLOCK, which is detected by the gap detector circuit 228 of the preamplifier circuitry 130 to trigger a reset of the preamplifier circuitry 130. The reset gap should be a predefined minimum length of time which is at least longer than (i) the period of time of a half cycle of the PCLOCK frequency operating at the lowest data rate, (ii) the longest run length, and (iii) longer than the clock gap length that is used to trigger a mode turnaround (as discussed above with reference to FIG. 7). The gap detector circuit 228 may be implemented using an asynchronous timer which receives as input the PCLOCK signal and performs a counting process in the absence of PCLOCK pulses. Each time a rising edge of the PCLOCK pulse is received, the asynchronous timer is reset. When the asynchronous counter overflows (count threshold), it is assumed that the reset gap is detected.

Figure 11:
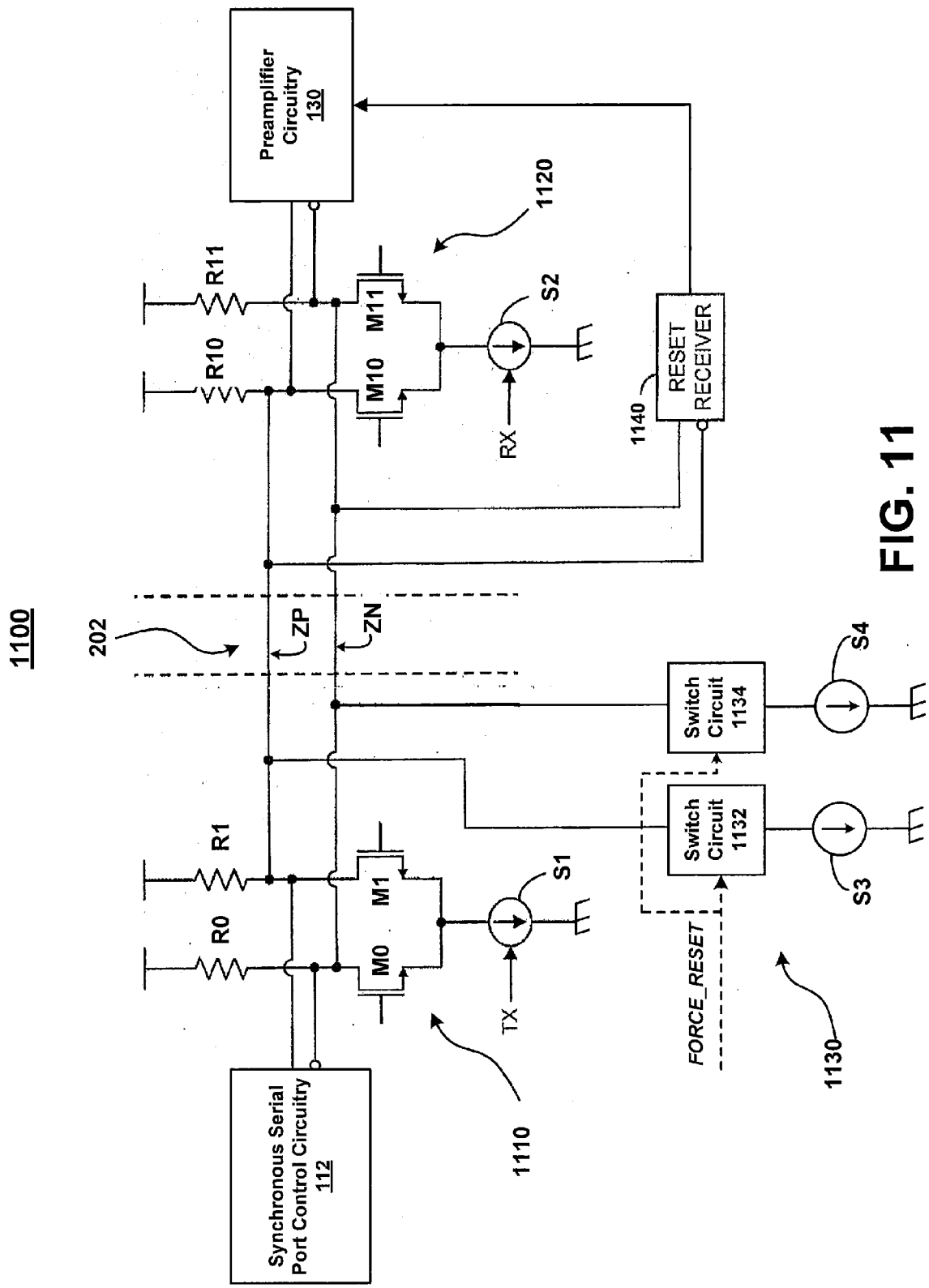
FIG. 11 is a diagram of a current mode logic implementation of a communication link with reset circuitry to force a reset of a preamplifier by temporarily changing a common-mode voltage on a bidirectional serial data line or a clock signal line of a digital bus, according to an embodiment of the invention.

In an alternative embodiment of the invention, a reset of the preamplifier circuitry 130 can be triggered by changing a common-mode voltage of the PCLOCK and/or PDATA signals. For example, FIG. 11 is a diagram of a current mode logic (CML) implementation of a communication link 1100 with reset circuitry to force a reset of a preamplifier by changing a common-mode voltage on a bidirectional serial data line or a clock signal line of a digital bus, according to an embodiment of the invention. As shown in FIG. 11, the communication link 1100 comprises a first differential amplifier 1110 and a second differential amplifier 1120 coupled to opposite ends of a differential line (ZP, ZN). The differential line (ZP, ZN) can be the bidirectional serial data line 202-1 or the clock signal line 202-2 of the digital bus 202, as discussed above. The first and second differential amplifiers 1110 and 1120 have a resistor-loaded CML amplifier topology, which drives a common mode voltage onto the differential line (ZP, ZN) to enable differential signal communication over the differential line (ZP, ZN) between the synchronous serial port control circuitry 112 and the preamplifier circuitry 130.

In particular, the first differential amplifier 1110 comprises a differential input stage formed by differential transistor pair M0 and M1 and load resistors R0 and R1. The gates of transistors M0 and M1 are differential inputs that receive as input a differential voltage to drive a common mode voltage on the differential line (ZP, ZN). The drains of transistors M0 and M1 are connected to the respective lines ZN and ZP of the differential line (ZP, ZN) to output a differential voltage (common mode voltage) on the differential line (ZP, ZN). The first differential amplifier 1110 further comprises a controllable tail current source S1 (controlled by an input TX) that generates a bias current for DC biasing the first differential amplifier 1110. Similarly, the second differential amplifier 1120 comprises a differential input stage formed by differential transistor pair M10 and M11 and load resistors R10 and R11. The gates of transistors M10 and M11 are differential inputs that receive as input a differential voltage to drive a common mode voltage on the differential line (ZP, ZN). The drains of transistors M10 and M11 are connected to the respective lines ZP and ZN of the differential line (ZP, ZN) to output a differential voltage (common mode voltage) on the differential line (ZP, ZN). The second differential amplifier 1120 further comprises a controllable tail current source S2 (controlled by an input RX) that generates a bias current for DC biasing the second differential amplifier 1120.

The communication link 1100 further comprises a common mode voltage adjustment circuit 1130 and a reset receiver 1140. The common mode voltage adjustment circuit 1130 comprises a first switch circuit 1132 and associated tail current source S3, and a second switch circuit 1134 and associated tail current source S4. In one embodiment of the invention, the first and second switch circuits 1132 and 1134 are transmission gates that are controlled by a reset control signal FORCE_RESET. When the preamplifier circuitry 130 needs to be reset, the controller temporarily asserts the FORCE_RESET signal to activate (turn on) the switch circuits and connect the current sources S3 and S4 to the differential signal lines ZP and ZN, respectively. In response, the common mode voltage of the differential line (ZP, ZN) is temporarily changed (e.g., decreased) due to the voltage drop generated across the load resistors R0 and R1 by virtue of the current sources S3 and S4 being temporarily connected to the respective differential signal lines ZP and ZN. The reset receiver 1140 detects this change in the common mode voltage. The reset receiver 1140 outputs a reset control signal to the preamplifier circuitry 130 to initiate a reset of the preamplifier circuitry 130.

Figure 12:
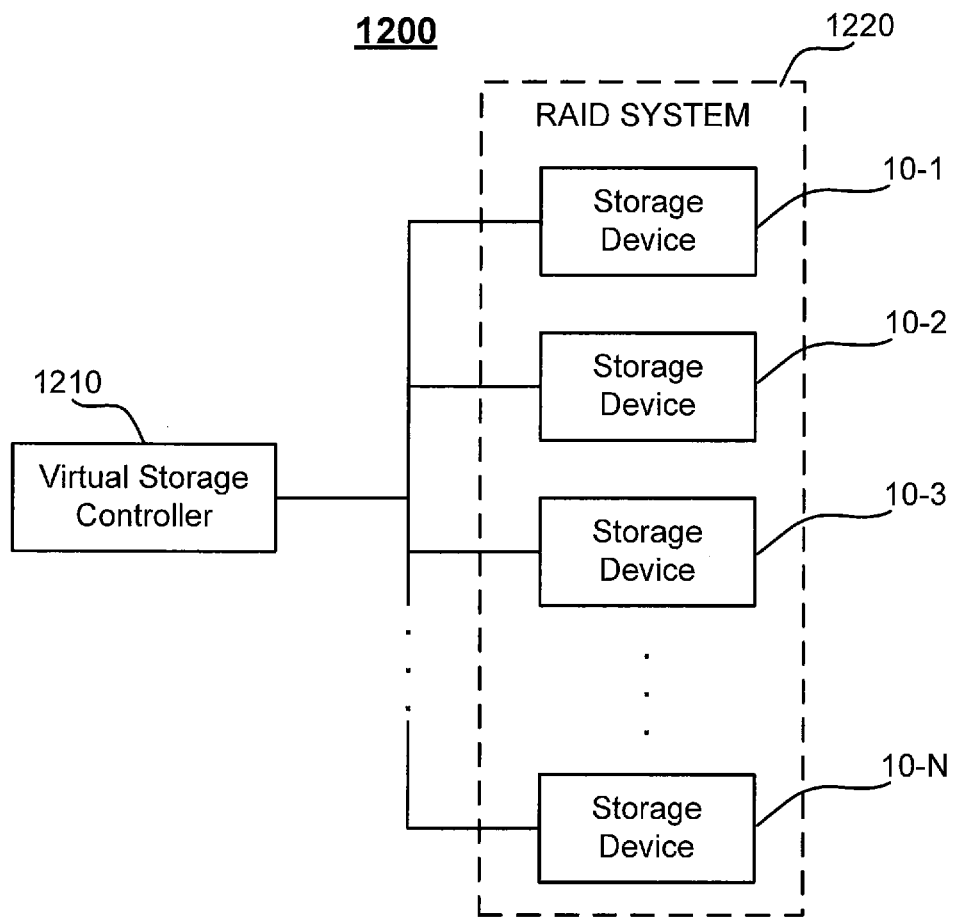
FIG. 12 is a block diagram of a virtual storage system incorporating a plurality of disk-based storage devices of the type shown in FIG. 1.

In other embodiments of the invention, multiple disk-based storage devices 10 (FIG. 1) may be incorporated into a virtual storage system as illustrated in FIG. 12. In particular, FIG. 12 is a block diagram of a virtual storage system 1200 incorporating a plurality of disk-based storage devices of the type shown in FIG. 1. The virtual storage system 1200, also referred to as a storage virtualization system, illustratively comprises a virtual storage controller 1210 coupled to a RAID system 1220, where RAID denotes Redundant Array of Independent Disks. The RAID system 1220 more specifically comprises N distinct storage devices denoted 10-1, 10-2, . . . , 10-N, one or more of which are assumed to be configured to include embodiments of the storage device 10 as shown in FIG. 1 with multiplexed communication control circuitry as discussed herein. These and other virtual storage systems comprising hard disk drives or other disk-based storage devices of the type disclosed herein are considered embodiments of the invention. A host processing device may also be an element of a virtual storage system, and may incorporate the virtual storage controller 1210.

Although embodiments of the invention have been described herein with reference to the accompanying drawings, it is to be understood that embodiments of the invention are not limited to the described embodiments, and that various changes and modifications may be made by one skilled in the art resulting in other embodiments of the invention within the scope of the following claims.

What is claimed is:

1. A method to implement multiplexed communication between a controller and a preamplifier in a storage device, comprising:
controlling a bidirectional serial data line of a digital bus to selectively transmit digital signals in either a first direction from the controller to the preamplifier or a second direction from the preamplifier to the controller, in response to a direction control signal, wherein the digital signals transmitted in the first direction include register data, and write mode and read mode control signals, and wherein the digital signals transmitted in the second direction include register read results, and fault polling results; and
concurrently transmitting a synchronous clock signal over a clock signal line of the digital bus from the controller to the preamplifier to synchronize transfer and processing of the digital signals transmitted on the bidirectional serial data line of the digital bus, wherein the direction control signal is transmitted from the controller to the preamplifier on one of the bidirectional serial data line and the clock signal line of the digital bus.

2. The method of claim 1, wherein the direction control signal comprises a 8 b/10 b code transmitted on the bidirectional serial data line.

3. The method of claim 1, wherein the direction control signal comprises a gap that is created in the synchronous clock signal by the controller and transmitted over the clock signal line of the digital bus, wherein the gap in the synchronous clock signal is detected by the preamplifier to initiate a direction switch for transmitting digital signals in the second direction.

4. The method of claim 1, further comprising:
performing a skew measurement process by the preamplifier, wherein the skew measurement process measures a time skew between a skew calibration stream transmitted on the bidirectional serial data line and the synchronous clock signal transmitted on the clock signal line of the digital bus;
transmitting a skew result from the preamplifier over the bidirectional serial data line; and
using the skew result to adjust a relative alignment between the synchronous clock signal transmitted on the clock signal line and digital signals transmitted on the bidirectional serial data line.

5. The method of claim 4, wherein the skew result is serially transmitted on the bidirectional serial data line synchronously with the synchronous clock signal operating a throttled-down frequency that is less than a normal operating clock signal frequency of the digital bus.

6. A method to implement communication between a controller and a preamplifier in a storage device, comprising:
initiating reset of the preamplifier;
following reset of the preamplifier, transmitting a synchronous clock signal over a clock signal line of a digital bus from the controller to the preamplifier, wherein the synchronous clock signal has a first frequency, and wherein the synchronous clock signal synchronizes transfer and processing of digital signals transmitted on a bidirectional serial data line of the digital bus;
serially transmitting a digital control signal and a skew calibration stream on the bidirectional serial data line from the controller to the preamplifier, wherein the digital control signal instructs the preamplifier to measure skew between the synchronous clock signal transmitted on the clock signal line and the skew calibration stream transmitted on the bidirectional serial data line; in response to the digital control signal, the preamplifier measuring skew between the synchronous clock signal and the skew calibration stream;
transmitting a skew measurement result from the preamplifier to the controller over the bidirectional serial data line, wherein the skew measurement result is transmitted synchronously with the synchronous clock signal at the first frequency; using the skew measurement result to align the synchronous clock signal to digital signals to be transmitted over the bidirectional serial data line; and
following alignment, increasing a frequency of the synchronous clock signal from the first frequency to a second frequency, which is greater than the first frequency.

7. The method of claim 6, wherein initiating reset of the preamplifier comprises creating a gap in the synchronous clock signal by the controller, wherein the gap in the synchronous clock signal is detected by the preamplifier to signal a reset of the preamplifier.

8. The method of claim 6, wherein initiating reset of the preamplifier comprises temporarily increasing a common-mode voltage on the bidirectional serial data line or the clock signal line of the digital bus.

9. The method of claim 6, wherein initiating reset of the preamplifier is performed on power-up of the preamplifier, wherein a skew measurement process is automatically performed after power-up of the preamplifier.

10. The method of claim 6, where serially transmitting the digital control signal and the skew calibration stream on the bidirectional serial data line from the controller to the preamplifier comprises: transmitting the digital control signal on the bidirectional serial data line while synchronized to the synchronous clock signal operating at the first frequency, increasing the frequency of the synchronous clock signal from the first frequency to the second frequency, and then transmitting the skew calibration stream on the bidirectional serial data line while synchronized to the synchronous clock signal operating at the second frequency; measuring the skew between the synchronous clock signal and the skew calibration stream with the synchronous clock signal operating at the second frequency; and decreasing the frequency of the synchronous clock signal from the second frequency to the first frequency to transmit the skew measurement result to the controller over the bidirectional serial data line with the synchronous clock signal operating at the first frequency.

11. A storage device, comprising:
a preamplifier;
a controller;
a digital bus comprising a clock signal line and a bidirectional serial data line connected between the preamplifier and the controller;
multiplexing circuitry configured to control bidirectional transmission of digital signals between the controller and preamplifier over the bidirectional serial data line;
a clock generator configured to generate a synchronous clock signal that is transmitted over the clock signal line of the digital bus from the controller to the preamplifier to synchronize transfer and processing of the digital signals transmitted over the bidirectional serial data line; and
port logic circuitry configured to control the multiplexing circuitry and the clock generator, wherein the port logic circuitry is configured to control the multiplexing circuitry to selectively transmit digital signals in either a first direction from the controller to the preamplifier or a second direction from the preamplifier to the controller, in response to a direction control signal generated at the command of the port logic circuitry, wherein the direction control signal is transmitted from the controller to the preamplifier on one of the bidirectional serial data line and the clock signal line of the digital bus, wherein the direction control signal comprises a gap that is created in the synchronous clock signal by the clock generator, under command of the port logic circuitry, and wherein the preamplifier comprises gap detector circuitry configured to detect the gap in the synchronous clock signal and send gap detection results to the port logic circuitry to initiate a direction switch for transmitting digital signals in the second direction.

12. The storage device of claim 11, wherein the direction control signal comprises a 8 b/10 b code transmitted on the bidirectional serial data line.

13. The storage device of claim 11, wherein the preamplifier comprises skew measurement circuitry, and wherein the controller comprises alignment circuitry, wherein the skew measurement circuitry is configured to measure skew between a synchronous clock signal transmitted on the clock signal line and a skew calibration stream transmitted on the bidirectional serial data line, in response to a digital control signal that is generated by the port logic circuitry and transmitted on the bidirectional serial data line from the controller to the preamplifier, wherein the skew measurement circuitry is configured to generate a skew measurement result that is transmitted to the controller over the bidirectional serial data line, wherein the skew measurement result is transmitted synchronously with the synchronous clock signal operating at a first frequency; wherein the alignment circuitry is configured to utilize the skew measurement result to align the synchronous clock signal to digital signals to be transmitted over the bidirectional serial data line; and wherein after alignment, the clock generator is configured to increase a frequency of the synchronous clock signal from the first frequency to a second frequency, wherein the second frequency is greater than the first frequency.

14. The storage device of claim 13, wherein the preamplifier comprises reset circuitry configured to reset the preamplifier prior to performing a skew measurement.

15. The storage device of claim 14, wherein the reset circuitry is configured to increase a common-mode voltage on the bidirectional serial data line or the clock signal line of the digital bus to reset the preamplifier.

16. The storage device of claim 14, wherein the preamplifier comprises gap detector circuitry configured to detect the gap in the synchronous clock signal and send gap detection results to the reset circuitry, wherein the reset circuitry resets the preamplifier in response to the gap detection results.

17. The storage device of claim 13, wherein the skew measurement circuitry is configured to measure skew while the synchronous clock signal is operating at the second frequency, and wherein the clock generator is configured to decrease the frequency of the synchronous clock signal from the second frequency to the first frequency prior to transmitting the skew measurement result to the controller over the bidirectional serial data line.

18. A virtual storage system comprising the storage device of claim 11.

19. A method to implement multiplexed communication between a controller and a preamplifier in a storage device, comprising:
controlling a bidirectional serial data line of a digital bus to selectively transmit digital signals in either a first direction from the controller to the preamplifier or a second direction from the preamplifier to the controller, in response to a direction control signal; and
concurrently transmitting a synchronous clock signal over a clock signal line of the digital bus from the controller to the preamplifier to synchronize transfer and processing of the digital signals transmitted on the bidirectional serial data line of the digital bus, wherein the direction control signal is transmitted from the controller to the preamplifier on one of the bidirectional serial data line and the clock signal line of the digital bus, wherein the direction control signal comprises a gap that is created in the synchronous clock signal by the controller and transmitted over the clock signal line of the digital bus, and wherein the gap in the synchronous clock signal is detected by the preamplifier to initiate a direction switch for transmitting digital signals in the second direction.

20. The method of claim 19, further comprising:
performing a skew measurement process by the preamplifier, wherein the skew measurement process measures a time skew between a skew calibration stream transmitted on the bidirectional serial data line and the synchronous clock signal transmitted on the clock signal line of the digital bus;
transmitting a skew result from the preamplifier over the bidirectional serial data line; and
using the skew result to adjust a relative alignment between the synchronous clock signal transmitted on the clock signal line and digital signals transmitted on the bidirectional serial data line.

21. The method of claim 20, wherein the skew result is serially transmitted on the bidirectional serial data line synchronously with the synchronous clock signal operating a throttled-down frequency that is less than a normal operating clock signal frequency of the digital bus.

22. The method of claim 19, wherein the digital signals transmitted in the first direction include register data, and write mode and read mode control signals, and wherein the digital signals transmitted in the second direction include register read results, and fault polling results.

* * * * *